(12) United States Patent
Takuma

(10) Patent No.: US 11,239,837 B2
(45) Date of Patent: Feb. 1, 2022

(54) SWITCH DEVICE

(71) Applicant: Rohm Co., Ltd., Kyoto (JP)

(72) Inventor: Toru Takuma, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 538 days.

(21) Appl. No.: 16/218,724

(22) Filed: Dec. 13, 2018

(65) Prior Publication Data

US 2019/0190512 A1 Jun. 20, 2019

(30) Foreign Application Priority Data

Dec. 15, 2017 (JP) .............................. JP2017-240790
Dec. 27, 2017 (JP) .............................. JP2017-251264
Oct. 22, 2018 (JP) .............................. JP2018-198509

(51) Int. Cl.

| | | |
|---|---|---|
| H02H 3/08 | (2006.01) | |
| H02H 9/02 | (2006.01) | |
| H03K 17/082 | (2006.01) | |
| B60R 16/03 | (2006.01) | |
| G01K 7/16 | (2006.01) | |
| H03K 17/16 | (2006.01) | |
| H02H 6/00 | (2006.01) | |
| H02M 3/156 | (2006.01) | |

(Continued)

(52) U.S. Cl.
CPC ......... *H03K 17/0828* (2013.01); *B60R 16/03* (2013.01); *G01K 7/01* (2013.01); *G01K 7/16* (2013.01); *H02H 3/08* (2013.01); *H02H 5/04* (2013.01); *H02H 6/00* (2013.01); *H02M 3/156* (2013.01); *H03K 17/168* (2013.01)

(58) Field of Classification Search
CPC .. H03K 17/0828; H03K 17/168; B60R 16/03; H02H 6/00; H02H 3/08; H02M 3/156
USPC ......................................................... 361/93.1
See application file for complete search history.

(56) References Cited

U.S. PATENT DOCUMENTS 6,392,392 B1 * 5/2002 Nakahara ........... H03K 17/0822
                                                           323/312
8,754,881 B2 * 6/2014 Murakami ............ H03F 3/3022
                                                            345/211

(Continued)

FOREIGN PATENT DOCUMENTS

JP       2015-035914        2/2015
JP       2016-208762       12/2016

*Primary Examiner* — Jared Fureman
*Assistant Examiner* — Lucy M Thomas
(74) *Attorney, Agent, or Firm* — Fish & Richardson P.C.

(57) ABSTRACT

A switch device includes a switching element that connects/disconnects a current path from a power supply terminal to a ground terminal via a load, and an overcurrent protection circuit that limits output current flowing in the switching element to be an overcurrent limit value or less. When an output short circuit of the load is detected, the overcurrent protection circuit decreases the overcurrent limit value to be lower as a power supply voltage is higher. In addition, the switch device preferably includes a switching element that connects/disconnects a current path from a power supply terminal to a ground terminal via a load, an intermittent control unit that intermittently drives the switching element when an abnormality is detected, and an output voltage monitoring portion that disables the intermittent control unit until an output voltage applied to the load reaches its target value.

8 Claims, 20 Drawing Sheets

(51) Int. Cl.
*H02H 5/04* (2006.01)
*G01K 7/01* (2006.01)

(56) References Cited

U.S. PATENT DOCUMENTS

| | | | | |
|---|---|---|---|---|
| 2008/0247099 A1* | 10/2008 | Hojo | ........................ | G05F 1/573 |
| | | | | 361/18 |
| 2009/0128106 A1* | 5/2009 | Takahashi | ................ | G05F 1/575 |
| | | | | 323/277 |
| 2015/0380924 A1* | 12/2015 | Ohwaki | ............... | H02H 3/0935 |
| | | | | 361/93.7 |
| 2017/0197566 A1 | 7/2017 | Nakamura et al. | | |

* cited by examiner

SWITCH DEVICE

CROSS-REFERENCE TO RELATED APPLICATIONS

This nonprovisional application claims priority under 35 U.S.C. § 119(a) on the following patent applications filed in Japan, the entire contents of which are hereby incorporated by reference.
(1) No. 2017-240790 filed on Dec. 15, 2017
(2) No. 2017-251264 filed on Dec. 27, 2017
(3) No. 2018-198509 filed on Oct. 22, 2018

BACKGROUND OF THE INVENTION

Field of the Invention

The invention disclosed in this specification relates to a switch device.

Description of Related Art

Conventionally, switch devices (such as a high side switch IC and a low side switch IC), which are on/off controlled in accordance with an external control signal, are used in various applications.

As examples of conventional techniques related to the above description, there are JP-A-2015-35914 and JP-A-2016-208762.

However, in the conventional switch device, there is more room for improvement in reducing power consumption or keeping constant the same when an output short circuit occurs, or in compatibility between stable startup and functional safety thereof.

Particularly in recent years, in-vehicle ICs are required to comply with ISO26262 (international standard for functional safety of electric and electronic systems in vehicles), so it is important to design reliability based on fail-safe principle for in-vehicle switch devices, too.

SUMMARY OF THE INVENTION

In view of the above-mentioned problem found by the inventors, it is an object of the invention disclosed in this specification to provide a switch device that can reduce power consumption or keep constant the same when an output short circuit occurs, or that can achieve both stable startup and functional safety.

A switch device disclosed in this specification includes switching element arranged to connect/disconnect a current path from a power supply terminal to a ground terminal via a load, and an overcurrent protection circuit arranged to limit output current flowing in the switching element to be an overcurrent limit value or less. When an output short circuit of the load is detected, the overcurrent protection circuit decreases the overcurrent limit value to be smaller as a power supply voltage is higher.

In addition, a switch device disclosed in this specification includes a switching element arranged to connect/disconnect a current path from a power supply terminal to a ground terminal via a load, an intermittent control unit arranged to intermittently drive the switching element when an abnormality is detected, and an output voltage monitoring portion arranged to disable the intermittent control unit until an output voltage applied to the load reaches its target value.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

<Semiconductor Integrated Circuit Device>

Figure 1:
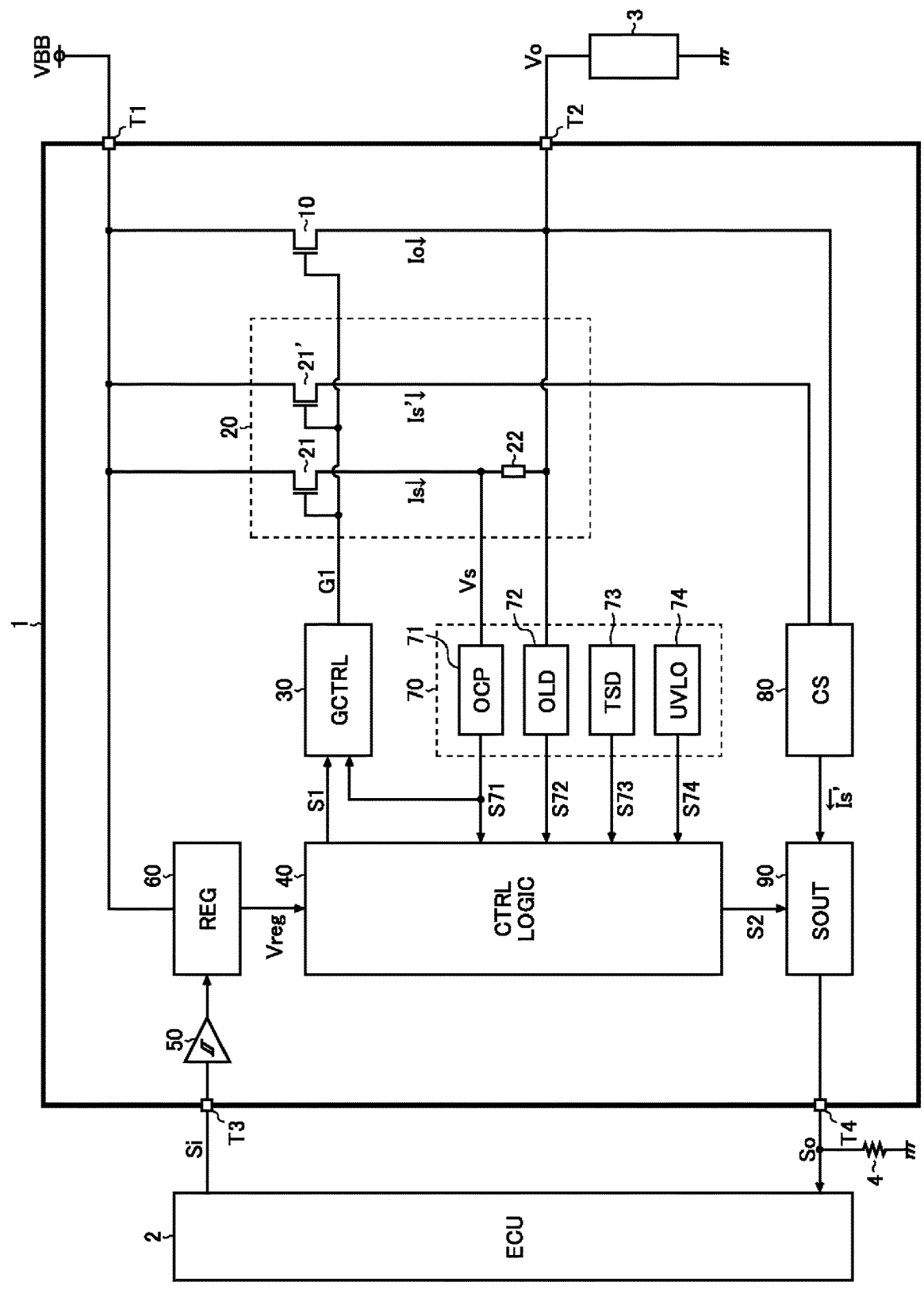
FIG. 1 is a block diagram illustrating an overall structure of a semiconductor integrated circuit device.

FIG. 1 is a block diagram illustrating an overall structure of a semiconductor integrated circuit device. A semiconductor integrated circuit device 1 of this structural example is an in-vehicle high side switch IC (one type of an in-vehicle intelligent power device (IPD)), which connects/disconnects between an application terminal of a power supply voltage VBB and a load 3 in accordance with an instruction from an electronic control unit (ECU) 2.

Note that the semiconductor integrated circuit device 1 has external terminals T1 to T4 as means for establishing electric connection with outside of the device. The external terminal T1 is a power supply terminal (VBB pin) for receiving power supply voltage VBB (e.g. 12 V) from a battery (not shown). The external terminal T2 is a load connection terminal (OUT pin) for externally connecting to the load 3 (one of a bulb lamp, a relay coil, a solenoid, a light emitting diode, a motor, and the like). The external terminal T3 is a signal input terminal (IN pin) for receiving external input of an external control signal Si from the ECU 2. The external terminal T4 is a signal output terminal (SENSE pin) for externally outputting a status signal So to the ECU 2. Note that an external sense resistor 4 is externally connected between the external terminal T4 and the ground terminal.

In addition, the semiconductor integrated circuit device 1 includes a NMOSFET 10, an output current monitoring portion 20, a gate control unit 30, a control logic portion 40, a signal input portion 50, an internal power supply portion 60, an abnormality protecting portion 70, an output current detection portion 80, and a signal output portion 90, which are integrated.

The NMOSFET 10 is a high withstand voltage (e.g. 42 V) power transistor having a drain connected to the external terminal T1 and a source connected to the external terminal T2. The NMOSFET 10 connected in this way functions as a switching element (high side switch) that connects/disconnects a current path from the application terminal of the power supply voltage VBB to the ground terminal via the load 3. The NMOSFET 10 is turned on when a gate drive signal G1 is at high level, and is turned off when the gate drive signal G1 is at low level.

Note that the NMOSFET 10 should be designed to have an on-resistance of a few m$\Omega$ to a few tens of m$\Omega$. As the on-resistance of the NMOSFET 10 is smaller, overcurrent flows more easily so that abnormal heating occurs more easily when a short circuit to ground from the external terminal T2 occurs (i.e. a short circuit to the ground terminal or a similar low potential terminal). Therefore, as the on-resistance of the NMOSFET 10 is set lower, an overcurrent protection circuit 71 or a temperature protection circuit 73 described later becomes more important.

The output current monitoring portion 20 includes NMOSFETs 21 and 21' and a sense resistor 22, so as to generate a sense voltage Vs corresponding to an output current Io flowing in the NMOSFET 10.

The NMOSFETs 21 and 21' are mirror transistors connected in parallel to the NMOSFET 10, so as to respectively generate sense currents Is and Is' corresponding to the output current Io. A size ratio between the NMOSFET 10 and each of the NMOSFETs 21 and 21' is m:1 (m>1). Therefore, the sense currents Is and Is' have a value corresponding to 1/m of the output current Io. Note that each of the NMOSFETs 21 and 21' is turned on when the gate drive signal G1 is at high level, and is turned off when a gate voltage G2 is at low level, similarly to the NMOSFET 10.

The sense resistor 22 (having a resistance of Rs) is connected between the source of the NMOSFET 21 and the external terminal T2, and is a current to voltage conversion element that generates the sense voltage Vs corresponding to a sense current Is (Vs=Is×Rs+Vo, where Vo is an output voltage at the external terminal T2).

The gate control unit 30 generates the gate drive signal G1 whose current capacity is increased from that of a gate control signal S1 and outputs the gate drive signal G1 to the gates of the NMOSFETs 10 and 21, so as to perform on/off control of the NMOSFETs 10 and 21. Note that the gate control unit 30 has a function to control the NMOSFETs 10 and 21 so that the output current Io is limited according to an overcurrent protection signal S71.

The control logic portion 40 is supplied with an internal power supply voltage Vreg so as to generate the gate control signal S1. For instance, when the external control signal Si is at high level (that is a logic level to turn on the NMOSFET 10), the internal power supply portion 60 supplies the internal power supply voltage Vreg, and the control logic portion 40 becomes an operating state so that the gate control signal S1 becomes high level (i.e. Vreg). On the contrary, when the external control signal Si is at low level (that is a logic level to turn off the NMOSFET 10), the internal power supply portion 60 does not supply the internal power supply voltage Vreg, and the control logic portion 40 becomes a non-operating state so that the gate control signal S1 becomes low level (i.e. GND). In addition, the control logic portion 40 monitors various abnormality protection signals (the overcurrent protection signal S71, an open protection signal S72, a temperature protection signal S73, and a reduced voltage protection signal S74). Note that the control logic portion 40 also has a function to generate an output switch signal S2 according to the monitor results of the overcurrent protection signal S71, the open protection signal S72, and the temperature protection signal S73 among the abnormality protection signals described above.

The signal input portion 50 is a schmitt trigger that receives the external control signal Si from the external terminal T3 and transmits it to the control logic portion 40 and the internal power supply portion 60. Note that the external control signal Si becomes high level when turning on the NMOSFET 10 and becomes low level when turning off the NMOSFET 10, for example.

The internal power supply portion 60 generates the predetermined internal power supply voltage Vreg from the power supply voltage VBB and supplies it to individual portions of the semiconductor integrated circuit device 1. Note that the internal power supply portion 60 is enabled or disabled by the external control signal Si. More specifically, the internal power supply portion 60 becomes the operating state when the external control signal Si is at high level and becomes the non-operating state when the external control signal Si is at low level.

The abnormality protecting portion 70 is a circuit block that detects various abnormalities of the semiconductor integrated circuit device 1 and includes the overcurrent protection circuit 71, an open protection circuit 72, the temperature protection circuit 73, and a reduced voltage protection circuit 74.

The overcurrent protection circuit 71 generates the overcurrent protection signal S71 corresponding to a monitor result of the sense voltage Vs (i.e. whether or not an overcurrent abnormality of the output current Io is generated). Note that the overcurrent protection signal S71 becomes low level when no abnormality is detected and becomes high level when an abnormality is detected, for example.

The open protection circuit 72 generates an open protection signal S72 corresponding to a monitor result of the output voltage Vo (i.e. whether or not an open abnormality of the load 3 is generated). Note that the open protection signal S72 becomes low level when no abnormality is detected and becomes high level when an abnormality is detected, for example.

The temperature protection circuit 73 includes a temperature detection element (not shown) that detects a temperature abnormality of the semiconductor integrated circuit device 1 (particularly inside or in a vicinity of the NMOSFET 10), so as to generate the temperature protection signal S73 corresponding to a detection result thereof (i.e. whether or not a temperature abnormality is generated). Note that the temperature protection signal S73 becomes low level when no abnormality is detected and becomes high level when an abnormality is detected, for example.

The reduced voltage protection circuit 74 (a so-called under voltage locked-out (UVLO) circuit) generates the reduced voltage protection signal S74 corresponding to a monitor result of the power supply voltage VBB or the internal power supply voltage Vreg (i.e. whether or not a reduced voltage abnormality is generated). Note that the reduced voltage protection signal S74 becomes low level when no abnormality is detected and becomes high level when an abnormality is detected, for example.

The output current detection portion 80 uses bias means (not shown) so as to make a source voltage of the NMOSFET 21' be coincide with the output voltage Vo, and thus sense current Is' (=Io/m) corresponding to the output current Io is generated and output to the signal output portion 90.

The signal output portion 90 selects one of the sense current Is' (corresponding to a detection result of the output current Io) and a fixed voltage V90 (corresponding to an abnormality flag, not shown in this diagram), on the basis of the output selection signal S2, so as to output the same to the external terminal T4. If the sense current Is' is selected and output, an output detection voltage V80 (i.e. Is'×R4) obtained by current-to-voltage conversion of the sense current Is' by the external sense resistor 4 (having a resistance of R4) is transmitted to the ECU 2 as the status signal So. Note that the output detection voltage V80 is higher as the output current Io is larger and is lower as the output current Io is smaller. In contrast, if the fixed voltage V90 is selected and output, the fixed voltage V90 is transmitted to the ECU 2 as the status signal So. Note that the fixed voltage V90 is preferably set to a voltage value higher than an upper limit value of the output detection voltage V80.

According to this signal output portion 90, both the detection result of the output current Io and the abnormality flag can be transmitted to the ECU 2 by using the single status signal So, and hence it is possible to contribute to reduction in the number of external terminals. Note that when reading a current value of the output current Io from the status signal So, analog-to-digital (A/D) conversion of the status signal So is performed. In contrast, when reading the abnormality flag from the status signal So, a logic level of the status signal So is determined using a threshold value a little lower than the fixed voltage V90.

<Gate Control Unit (First Structural Example)>

Figure 2:
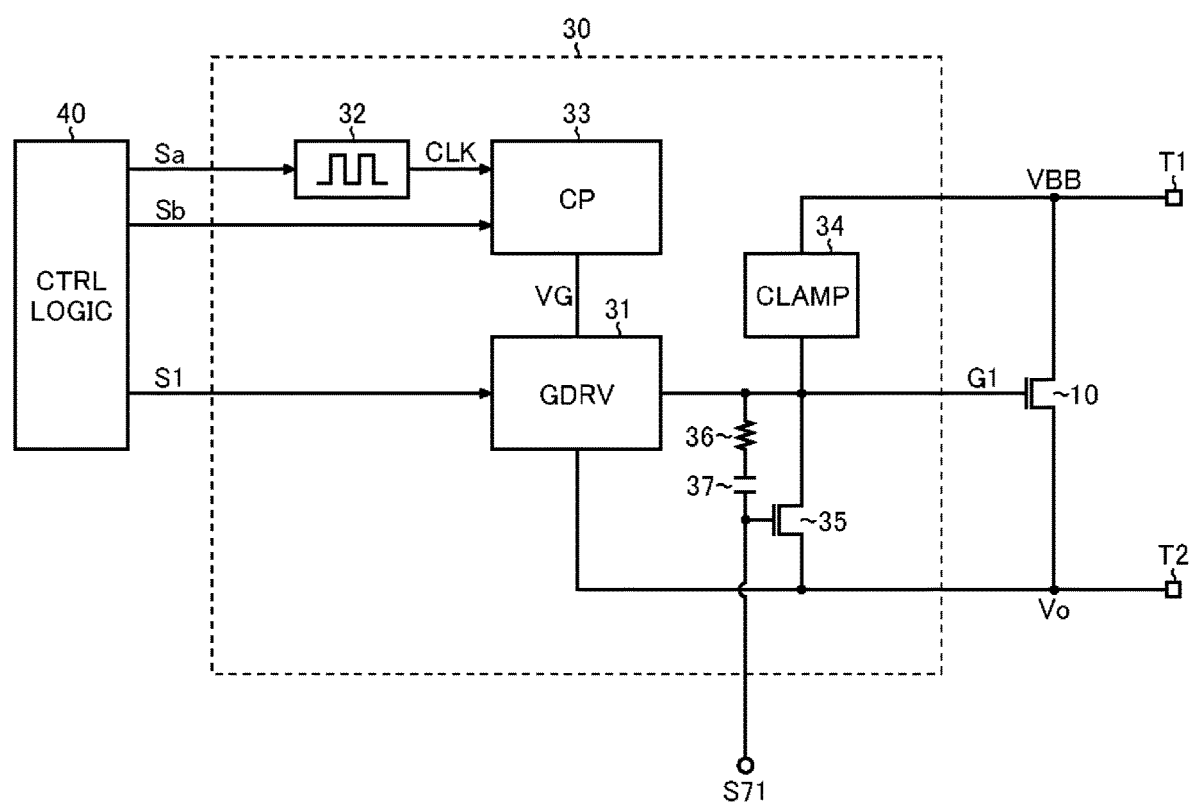
FIG. 2 is a block diagram illustrating a first structural example of a gate control unit.

FIG. 2 is a block diagram illustrating a first structural example of the gate control unit 30. The gate control unit 30 of this structural example includes a gate driver 31, an oscillator 32, a charge pump 33, a clamper 34, an NMOSFET 35, a resistor 36 (having a resistance of R36), and a capacitor 37 (having a capacitance of C37).

The gate driver 31 is connected between an output terminal of the charge pump 33 (i.e. an application terminal of a stepped-up voltage VG) and an external terminal T2 (i.e. the application terminal of the output voltage Vo), so as to generate the gate drive signal G1 whose current capacity is increased from that of the gate control signal S1. Note that the gate drive signal G1 becomes high level (i.e. VG) when the gate control signal S1 is at high level and becomes low level (i.e. Vo) when the gate control signal S1 is at low level.

The oscillator 32 generates a clock signal CLK having a predetermined frequency and outputs it to the charge pump 33. Note that the oscillator 32 is enabled or disabled by an enable signal Sa from the control logic portion 40.

The charge pump 33 drives a flying capacitor using the clock signal CLK so as to generate the stepped-up voltage VG that is higher than the power supply voltage VBB. Note that the charge pump 33 is enabled or disabled by an enable signal Sb from the control logic portion 40.

The clamper 34 is connected between the external terminal T1 (i.e. the application terminal of the power supply voltage VBB) and the gate of the NMOSFET 10. In an application in which an inductive load 3 is connected to the external terminal T2, when the NMOSFET 10 is switched from on to off, a counter electromotive force of the load 3 makes the output voltage Vo be a negative voltage (<GND). For this reason, the clamper 34 (so-called active clamp circuit) is disposed for absorption of energy.

The drain of the NMOSFET 35 is connected to the gate of the NMOSFET 10. The source of the NMOSFET 35 is connected to the external terminal T2. The gate of the NMOSFET 35 is connected to the application terminal of the overcurrent protection signal S71. In addition, the resistor 36 and the capacitor 37 are connected in series between the drain and gate of the NMOSFET 35.

When the overcurrent protection signal S71 is raised to high level in the gate control unit 30 of this structural example, the gate drive signal G1 is decreased from high level (i.e. VG) in the normal state with a predetermined time constant τ (=R36×C37). As a result, a conduction degree of the NMOSFET 10 is gradually decreased, and hence the output current Io is limited. On the contrary, when the overcurrent protection signal S71 is reduced to low level, the gate drive signal G1 is increased with the predetermined time constant T. As a result, the conduction degree of the NMOSFET 10 is gradually increased, and hence the limitation of the output current Io is cancelled.

In this way, the gate control unit 30 of this structural example has a function to control the gate drive signal G1 so that the output current Io is limited according to the overcurrent protection signal S71.

<Current Protection Circuit>

Figure 3:
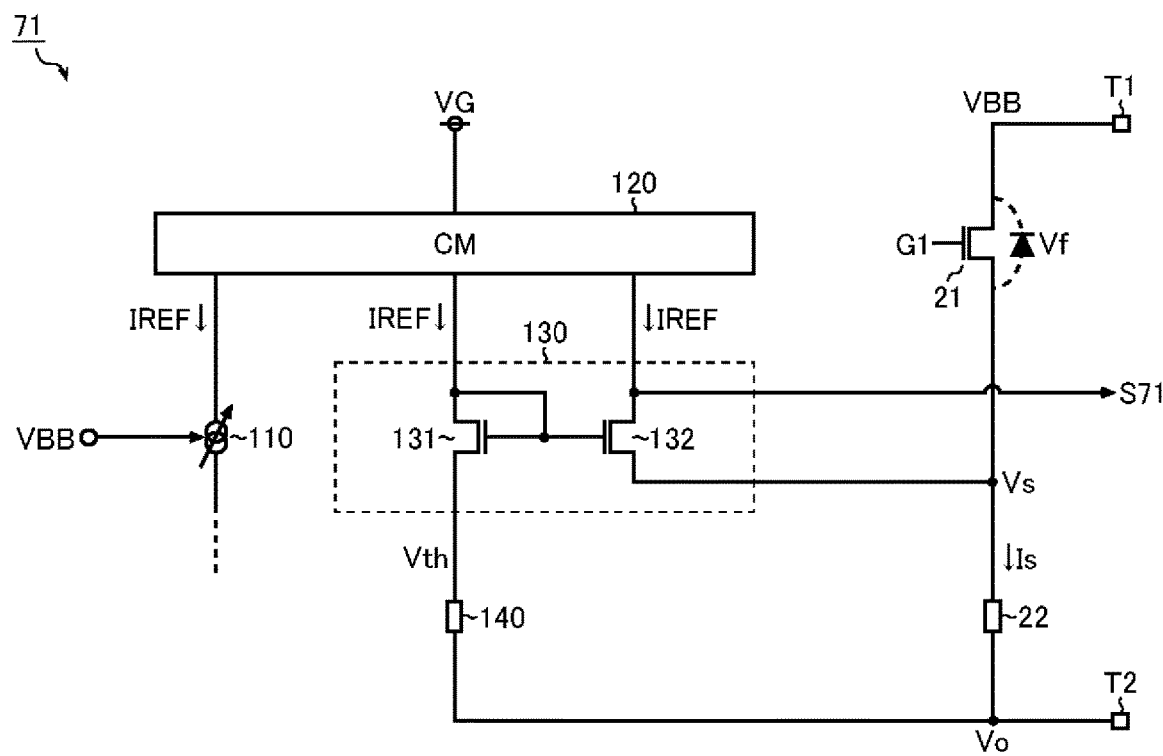
FIG. 3 is a structural example of an overcurrent protection circuit.

FIG. 3 is a diagram illustrating a structural example of the overcurrent protection circuit 71. The overcurrent protection circuit 71 of this structural example includes a reference current generation portion 110, a current mirror 120, a comparison portion 130, and a resistor 140 (having a resistance of R140).

The reference current generation portion 110 generates a reference current IREF. Note that the reference current generation portion 110 has a function to decrease the reference current IREF to be linearly smaller as the power supply voltage VBB is higher when an output short circuit of the load 3 is detected (i.e. when a short circuit to ground from the external terminal T2 is detected in the case of high side switch IC). This point is described later.

The current mirror 120 mirrors the reference current IREF input to an input terminal and outputs the same from the first output terminal and the second output terminal, respectively.

The comparison portion 130 includes a pair of NMOSFETs 131 and 132 and has a structure as a co-called current mirror type comparator.

The gates of the transistors 131 and 132 are both connected to the drain of the transistor 131. The drain of the transistor 131 is connected to a first output terminal of the current mirror 120 and flows the reference current IREF. The source of the transistor 131 is connected to a first terminal of the resistor 140 (corresponding to an application terminal of a threshold value voltage Vth). The second terminal of the resistor 140 is connected to the application terminal of the output voltage Vo (i.e. the external terminal T2). The drain of the transistor 132 is connected to a second output terminal of the current mirror 120 and flows the reference current IREF. The drain of the transistor 132 is connected also to an output terminal of the overcurrent protection signal S71. The source of the transistor 132 is connected to the source of the NMOSFET 21 and a first terminal of the sense resistor 22 (i.e. an application terminal of the sense voltage Vs). The second terminal of the sense resistor 22 is connected to the application terminal of the output voltage Vo (i.e. the external terminal T2). The drain of the NMOSFET 21 is connected to the application terminal of the power supply voltage VBB (i.e. the external terminal T1).

The comparison portion 130 of this structural example operates using the output voltage Vo as a reference potential, and compares the threshold value voltage Vth corresponding to the reference current IREF (Vth=IREF×R140+Vo) with the sense voltage Vs (=Is×Rs+Vo) corresponding to the output current Io (sense current Is), so as to generate the overcurrent protection signal S71. Note that the overcurrent protection signal S71 becomes low level (i.e. a logic level when overcurrent is not detected) when the sense voltage Vs is lower than the threshold value voltage Vth, and becomes high level (i.e. a logic level when overcurrent is detected) when the sense voltage Vs is higher than the threshold value voltage Vth.

<Reference Current Generation Portion>

Figure 4:
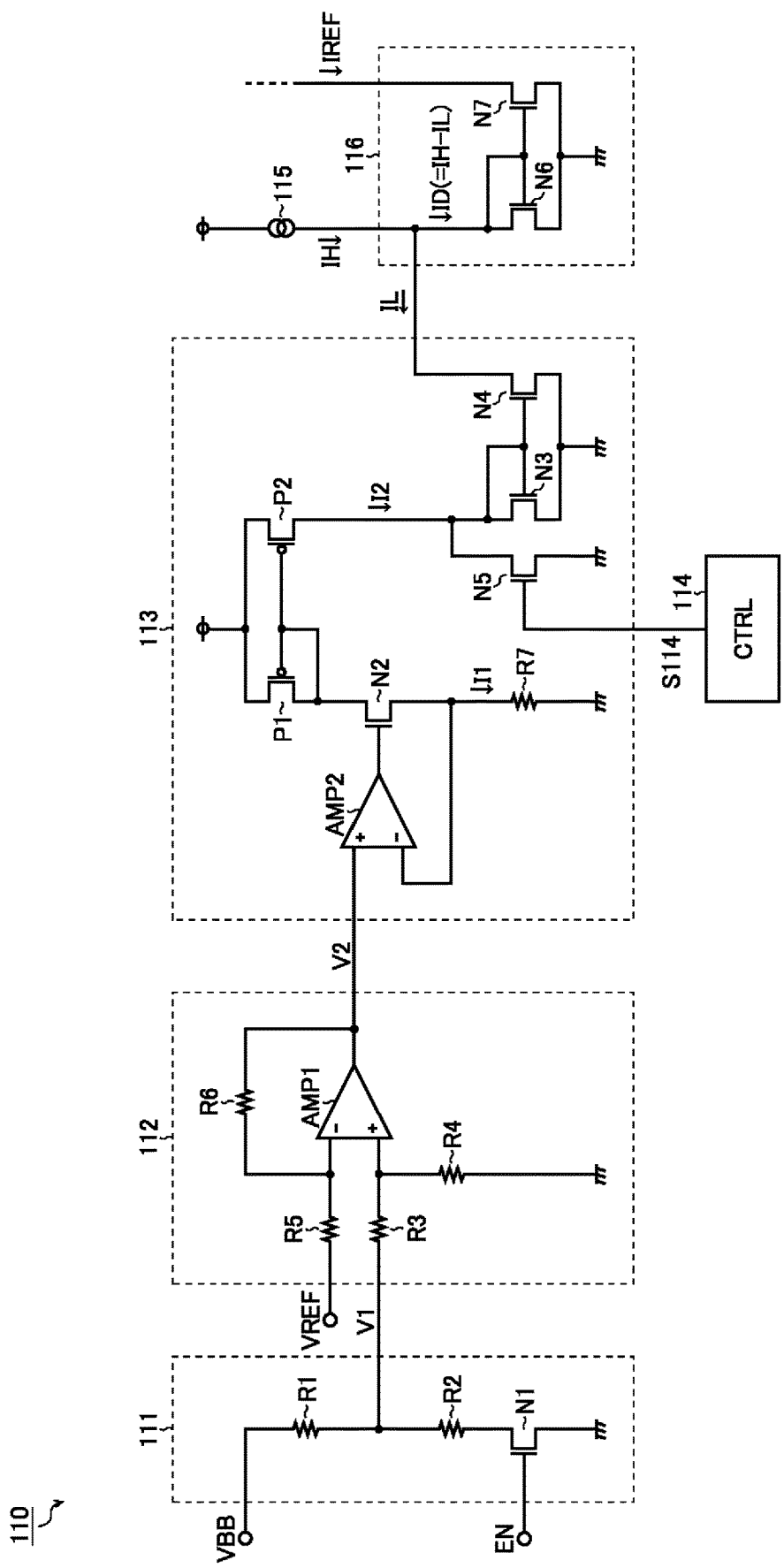
FIG. 4 is a diagram illustrating a structural example of a reference current generation portion.

FIG. 4 is a diagram illustrating a structural example of the reference current generation portion 110. The reference current generation portion 110 of this structural example includes a voltage divider portion 111, a differential amplifier portion 112, a lower side current generation portion 113, a lower side current control unit 114, an upper side current generation portion 115, and a difference current generation portion 116.

The voltage divider portion 111 includes resistors R1 and R2, and an N-channel MOS field effect transistor N1, so as to generate a divided voltage V1 (=VBB×(R2/(R1+R2))) corresponding to the power supply voltage VBB. The connection relationship of the components is as follows. A first terminal of the resistor R1 is connected to the application terminal of the power supply voltage VBB. A second terminal of the resistor R1 and a first terminal of the resistor R2 are connected to an output terminal of the divided voltage V1. A second terminal of the resistor R2 is connected to the drain of the transistor N1. The source of the transistor N1 is connected to the ground terminal. The gate of the transistor N1 is connected to an input terminal of an enable signal EN.

The transistor N1 is turned on when the enable signal EN is at high level, and is turned off when the enable signal EN is at low level. Therefore, the voltage divider portion 111 is enabled or disabled according to the enable signal EN. As the enable signal EN, it is possible to use the external control signal Si, for example, which is transmitted from the external terminal T3 via the signal input portion 50.

If the power supply voltage VBB is within an input dynamic range of the differential amplifier portion 112, the voltage divider portion 111 can be eliminated, and the power supply voltage VBB can be directly input to the differential amplifier portion 112.

The differential amplifier portion 112 includes an operational amplifier AMP1 and resistors R3 to R6, and it amplifies a difference value between the divided voltage V1 and the predetermined reference voltage VREF so as to generate a differential amplified voltage V2. The connection relationship of the components is as follows. A first terminal of the resistor R3 is connected to an input terminal of the divided voltage V1. A second terminal of the resistor R3 and a first terminal of the resistor R4 are connected to a non-inverting input terminal (+) of the operational amplifier AMP1. A second terminal of the resistor R4 is connected to the ground terminal. A first terminal of the resistor R5 is connected to an input terminal of the reference voltage VREF. A second terminal of the resistor R5 and a first terminal of the resistor R6 are connected to an inverting input terminal (−) of the operational amplifier AMP1. A second terminal of the resistor R6 is connected to an output terminal of the operational amplifier AMP1 (i.e. an output terminal of the differential amplified voltage V2).

In the differential amplifier portion 112 having the structure described above, the differential amplified voltage V2 can be calculated using the following equation (1).

[Mathematical 1]

$$V2 = \frac{R2 \cdot R4 \cdot (R5 + R6)}{(R1 + R2) \cdot (R3 + R4) \cdot R5} VBB - \frac{R6}{R5} VREF = \alpha VBB - \beta VREF \quad (1)$$

$$\left( \alpha = \frac{R2 \cdot R4 \cdot (R5 + R6)}{(R1 + R2) \cdot (R3 + R4) \cdot R5}, \beta = \frac{R6}{R5} \right)$$

The above equation (1) holds when the power supply voltage VBB is higher than a predetermined threshold value voltage VTH (=(β/α) VREF), and V2=0 holds when the power supply voltage VBB is lower than the threshold value voltage VTH. In other words, when VBB<VTH holds, a lower side current IL described later is zero.

Note that the threshold value voltage VTH should be set to a voltage value (e.g. 30 V) that is higher than a normal value Vnormal (e.g. 14 V) of the power supply voltage VBB and is lower than a maximum rated value Vmax (e.g. 40 V). According to this setting, as long as the power supply voltage VBB has a normal value Vnormal (or its approximate value), the reference current IREF (therefore an overcurrent limit value Iocd of the output current Io) is not decreased. Therefore, unnecessarily strict overcurrent limitation is not performed, and hence operational stability of the semiconductor integrated circuit device 1 is not lost.

The lower side current generation portion 113 includes an operational amplifier AMP2, N-channel MOS field effect transistors N2 to N5, and P-channel MOS field effect transistors P1 and P2, so as to generate the lower side current IL corresponding to the differential amplified voltage V2.

The connection relationship of the components is as follows. A non-inverting input terminal (+) of the operational amplifier AMP2 is connected to an application terminal of the differential amplified voltage V2. An inverting input terminal (−) of the operational amplifier AMP2 and the source of the transistor N2 are connected to a first terminal of a resistor R7. A second terminal of the resistor R7 is connected to the ground terminal. An output terminal of the operational amplifier AMP2 is connected to the gate of the transistor N2.

The operational amplifier AMP2 connected in this way controls the gate of the transistor N2 so that a virtual short circuit is formed between the non-inverting input terminal (+) and the inverting input terminal (−). As a result, a variable current I1 (=V2/R7) corresponding to the differential amplified voltage V2 flows in the resistor R7. Note that the variable current I1 is larger as the differential amplified voltage V2 is higher, and is smaller as the differential amplified voltage V2 is lower.

The drain of the transistor N2 is connected to the drain of the transistor P1. The gates of the transistors P1 and P2 are both connected to the drain of the transistor P1. The sources of the transistors P1 and P2 are both connected to the power supply terminal. The transistors P1 and P2 connected in this way function as a first current mirror that outputs a mirror current I2 corresponding to the variable current I1 (e.g. I2=I1) from the drain of the transistor P2.

The drain of the transistor P2 is connected to the drain of the transistor N3. The gates of the transistors N3 and N4 are both connected to the drain of the transistor N3. The sources of the transistors N3 and N4 are both connected to the ground terminal. The transistors N3 and N4 connected in this way function as a second current mirror that outputs the lower side current IL corresponding to the mirror current I2 (e.g. IL=I2) from the drain of the transistor N4.

The drain of the transistor N5 is connected to the drain of the transistor N3. The source of the transistor N5 is connected to the ground terminal. The gate of the transistor N5 is connected to an input terminal of a lower side current control signal S114. The transistor N5 connected in this way is turned on when the lower side current control signal S114 is at high level (i.e. a logic level when being disabled), and is turned off when the lower side current control signal S114 is at low level (i.e. a logic level when being enabled).

Note that when the transistor N5 is turned on, the gate and the source of each of the transistors N3 and N4 are short-circuited to each other, and hence the second current mirror is disabled. Therefore, the lower side current IL is fixed to zero. On the contrary, when the transistor N5 is turned off, the gate and the source of each of the transistors N3 and N4 are disconnected from each other, and hence the second current mirror is enabled. In this case, the lower side current IL has a current value corresponding to the mirror current I2 (therefore the variable current I1). As a result, the lower side current IL is larger as the differential amplified voltage V2 is higher, and is smaller as the differential amplified voltage V2 is lower.

The lower side current control unit 114 generates the lower side current control signal S114 described above. Note that an internal structure of the lower side current control unit 114 is described later.

The upper side current generation portion 115 generates a predetermined upper side current IH. Note that it is preferred to appropriately set the upper side current IH according to an on-resistance and a withstand voltage of the NMOSFET 10, so that the semiconductor integrated circuit device 1 is not damaged even if an output short circuit of the load 3 occurs.

The difference current generation portion 116 includes N-channel MOS field effect transistors N6 and N7, and generates a difference current ID (=IH−IL) obtained by subtracting the lower side current IL from the upper side current IH, so as to output it as the reference current IREF.

The connection relationship of the components is as follows. The drain of the transistor N6 is connected to an output terminal of the lower side current generation portion 113 (i.e. the drain of the transistor N4) and an output terminal of the upper side current generation portion 115. The gates of the transistors N6 and N7 are both connected to the drain of the transistor N6. The sources of the transistors N6 and N7 are both connected to the ground terminal. The transistors N6 and N7 connected in this way function as a third current mirror that outputs the reference current IREF corresponding to the difference current ID (e.g. IREF=ID) from the drain of the transistor N7.

<Lower Side Current Control Unit>

Figure 5:
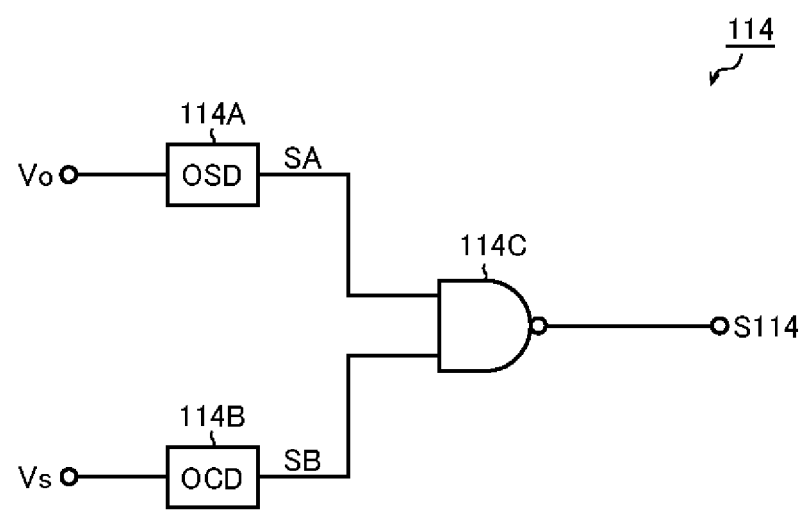
FIG. 5 is a diagram illustrating a first structural example of a lower side current control unit.

FIG. 5 is a diagram illustrating a first structural example of the lower side current control unit 114. The lower side current control unit 114 of this structural example includes an output short circuit detection portion 114A, an overcurrent detection portion 114B, and a NAND gate 114C.

The output short circuit detection portion 114A monitors the output voltage Vo and detects an output short circuit of the load 3 (i.e. a short circuit to ground from the external terminal T2 in the case of the high side switch IC), so as to generate an output short circuit detection signal SA. The output short circuit detection signal SA becomes low level when no abnormality is detected, and becomes high level when an abnormality is detected.

The overcurrent detection portion 114B monitors the sense voltage Vs and detects an overcurrent abnormality of the output current Io, so as to generate an overcurrent detection signal SB. The overcurrent detection signal SB becomes low level when no abnormality is detected, and becomes high level when an abnormality is detected. Note that the overcurrent detection portion 114B corresponds to the comparison portion 130 described above (see FIG. 3), and the overcurrent detection signal SB corresponds to the overcurrent protection signal S71.

The NAND gate 114C generates a NAND signal between the output short circuit detection signal SA and the overcurrent detection signal SB, and outputs it as the lower side current control signal S114. Therefore, the lower side current control signal S114 becomes high level (i.e. a logic level when being disabled) when at least one of the output short circuit detection signal SA and the overcurrent detection signal SB is at low level, and becomes low level (i.e. a logic level when being enabled) when both the output short circuit detection signal SA and the overcurrent detection signal SB are at high level.

In other words, the lower side current control unit 114 of this structural example generates the lower side current control signal S114, so as to stop output of the lower side current IL when at least one of an output short circuit of the load 3 and an overcurrent abnormality of the output current Io is not detected.

With this structure, in normal operation, the reference current IREF (therefore the overcurrent limit value Iocd of the output current Io) is not decreased. Consequently, unnecessarily strict overcurrent limitation is not performed, and hence operational stability of the semiconductor integrated circuit device 1 is not lost.

Figure 6:
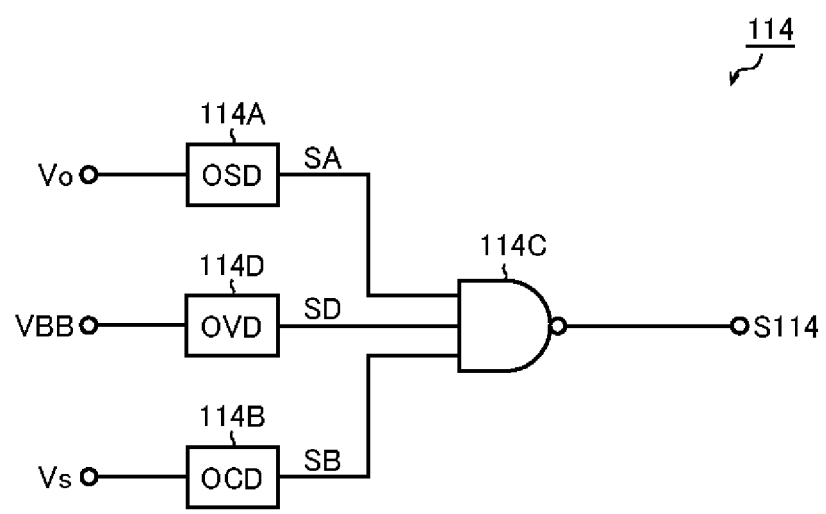
FIG. 6 is a diagram illustrating a second structural example of the lower side current control unit.

FIG. 6 is a diagram illustrating a second structural example of the lower side current control unit 114. The lower side current control unit 114 of this structural example is based on the first structural example (FIG. 5) and further includes an overvoltage detection portion 114D.

The overvoltage detection portion 114D monitors the power supply voltage VBB and detects its overvoltage abnormality, so as to generate an overvoltage detection signal SD. The overvoltage detection signal SD becomes low level when no abnormality is detected, and becomes high level when an abnormality is detected. Note that as the overvoltage detection portion 114D, it is possible to use a comparator that compares the divided voltage V1 with a predetermined threshold value voltage VTH2 (−(R2/(R1+R2)) VTH).

In other words, the lower side current control unit 114 of this structural example generates the lower side current control signal S114 so as to stop output of the lower side current IL, not only when at least one of an output short circuit of the load 3 and an overcurrent abnormality of the output current Io is not detected, but also when no overvoltage abnormality of the power supply voltage VBB is detected.

With this structure, when VBB<VTH holds, even if the differential amplified voltage V2 is raised from zero because of a certain cause (such as an input offset of the operational amplifier AMP1) so that the variable current I1 (and the mirror current I2 corresponding to the variable current I1)

unintentionally flows out, the lower side current IL can be fixed to zero. Therefore, until VBB becomes higher than VTH, a decrease of the reference current IREF (therefore the overcurrent limit value Iocd of the output current Io) can be securely stopped.

<Output Short Circuit Detection Portion>

Figure 7:
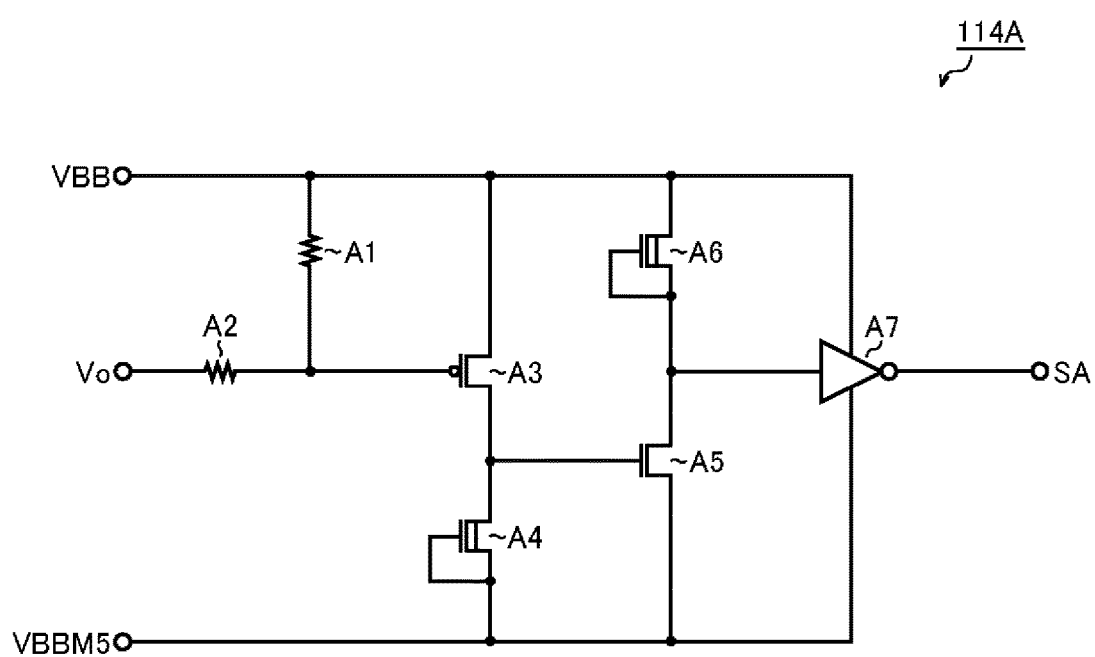
FIG. 7 is a diagram illustrating a structural example of an output short circuit detection portion.

FIG. 7 is a diagram illustrating a structural example of the output short circuit detection portion 114A. The output short circuit detection portion 114A of this structural example includes resistors A1 and A2, a P-channel MOS field effect transistor A3, N-channel MOS field effect transistors A4 to A6, and an inverter A7. Note that the transistors A3 and A5 are enhancement types, and the transistors A4 and A6 are depletion types.

A first terminal of the resistor A1 is connected to the application terminal of the power supply voltage VBB (i.e. the external terminal T1). A first terminal of the resistor A2 is connected to the application terminal of the output voltage Vo (i.e. the external terminal T2). Second terminals of the resistors A1 and A2 are connected to the gate of the transistor A3. The source of the transistor A3 is connected to the application terminal of the power supply voltage VBB. The drain of the transistor A3 is connected to the drain of the transistor A4 and the gate of the transistor A5. The source and gate of the transistor A4 and the source of the transistor A5 are connected to an application terminal of a constant voltage VBBM5.

Note that the constant voltage VBBM5 is an internal voltage of the semiconductor integrated circuit device 1 and is approximately VBB-5 V.

The drain of the transistor A6 is connected to the application terminal of the power supply voltage VBB. The source and gate of the transistor A6 and the drain of the transistor A5 are connected to an input terminal of the inverter A7. An output terminal of the inverter A7 is connected to an output terminal of the output short circuit detection signal SA. A first power supply terminal of the inverter A7 (high potential side) is connected to the application terminal of the power supply voltage VBB. A second power supply terminal of the inverter A7 (low potential side) is connected to an application terminal of the constant voltage VBBM5.

In the output short circuit detection portion 114A of this structural example, when the output voltage Vo becomes lower than predetermined value (e.g. VBB-3 V), the transistor A3 is turned on, and the transistor A5 is turned on. As a result, an input signal to the inverter A7 becomes low level, and hence the output short circuit detection signal SA becomes high level (i.e. a logic level when an abnormality is detected).

In this way, the output short circuit detection portion 114A of this structural example can detect an output short circuit of the load 3 (i.e. a short circuit to ground from the external terminal T2) with a very simple circuit structure.

<Linear Control of Overcurrent Limit Value>

Next, technical meaning of introducing a linear control function of the overcurrent limit value Iocd is described in detail. In the semiconductor integrated circuit device 1, power consumption Pc of the NMOSFET 10 (Pc=Io×Vds, where Vds is a drain-source voltage of the NMOSFET 10) becomes maximum when an output short circuit of the load 3 occurs (a short circuit to ground in the high side switch IC, or a short circuit to power supply voltage in the low side switch IC).

Note that when an output short circuit of the load 3 occurs so that overcurrent limitation of the output current Io is performed, Io=Iocd holds, and Vds=VBB holds. As a result, the maximum value of the power consumption Pc (i.e. Iocd×VBB) is proportional to each of the overcurrent limit value Iocd of the output current Io and the power supply voltage VBB. Therefore, it is understood that the overcurrent limit value Iocd of the output current Io should be decreased, in order to reduce the power consumption Pc or keep constant the same when an output short circuit of the load 3 occurs.

However, the load 3 to be driven by the semiconductor integrated circuit device 1 may require an instantaneous large output current Io in the normal operation. For instance, an inrush current larger than normal operation current flows instantaneously in startup of a capacitive load such as a bulb lamp. Therefore, if the overcurrent limit value Iocd is simply set to a lower value, the load 3 may not be supplied with an appropriate output current Io, so that normal operation of the semiconductor integrated circuit device 1 may be interfered.

Therefore, it is important to set the overcurrent limit value Iocd to an original set value in the normal operation of the semiconductor integrated circuit device 1, and to appropriately decrease the overcurrent limit value Iocd from the original set value when it is necessary to reduce the power consumption Pc or keep constant the same. Such linear control of the overcurrent limit value Iocd is specifically described below with reference to the drawings.

Figure 8:
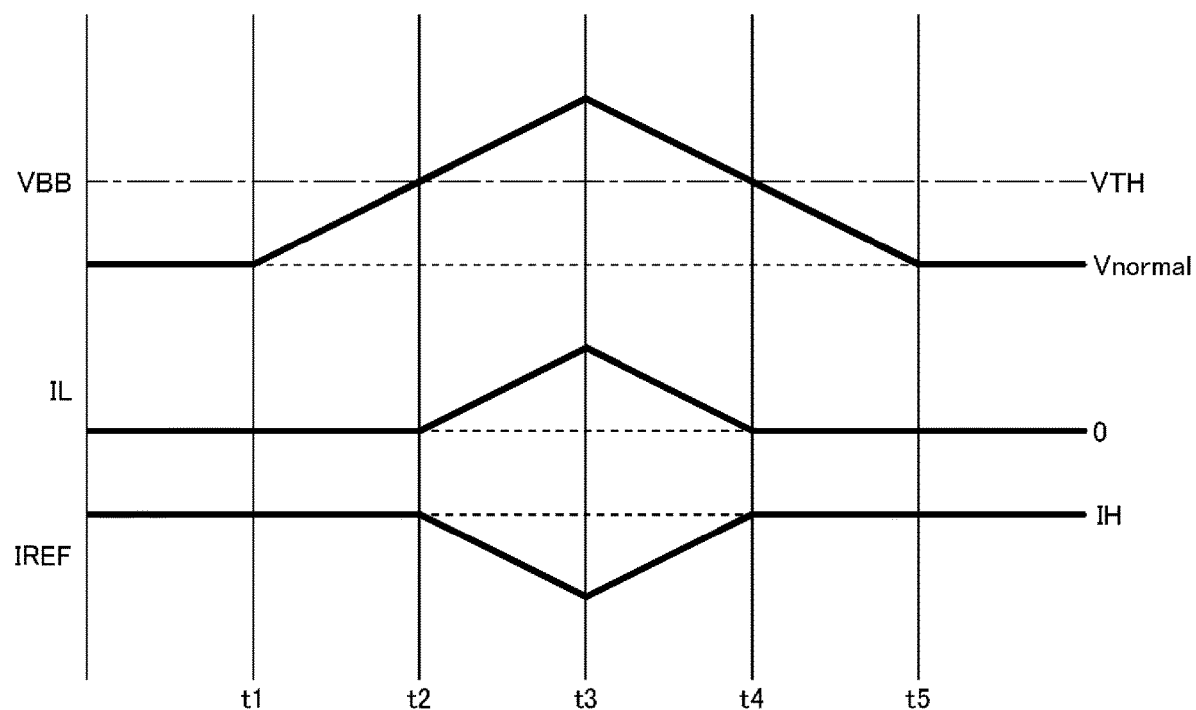
FIG. 8 is a timing chart illustrating linear control of a reference current.

FIG. 8 is a timing chart showing linear control of the reference current IREF (therefore the overcurrent limit value Iocd of the output current Io), in which the power supply voltage VBB, the lower side current IL, and the reference current IREF (=IH−IL) are shown in order from top to bottom. As an assumption of this chart, it is supposed that an output short circuit of the load 3 and an overcurrent abnormality of the output current Io are both detected in the semiconductor integrated circuit device 1 (SA=SB=H in FIG. 5 or 6).

The power supply voltage VBB is maintained at the normal value Vnormal (<VTH) until time t1. Therefore, the lower side current IL is zero so that the reference current IREF is equal to the upper side current IH. Note that IL=0 holds because the differential amplified voltage V2 is zero when VBB<VTH holds. In addition, if the lower side current control unit 114 adopts the second structural example (FIG. 6) described above, even if the differential amplified voltage V2 is raised from zero because of a certain cause, the lower side current IL is fixed to zero. This point is already described above.

At the time t1, the power supply voltage VBB starts to increase from the normal value Vnormal. However, from the time t1 to time t2, VBB<VTH still holds, and hence the lower side current IL is maintained at zero similarly to before the time t1. Therefore, the reference current IREF is not decreased and is maintained at the same value as the upper side current IH.

At the time t2, when the power supply voltage VBB becomes higher than the threshold value voltage VTH, the lower side current IL starts to flow, thereby the reference current IREF is decreased. Note that the lower side current IL increases higher as the power supply voltage VBB is higher. Therefore, the reference current IREF decreases along with an increase in the power supply voltage VBB.

When the power supply voltage VBB changes from increase to decrease at time t3, the lower side current IL starts to decrease, and hence the reference current IREF changes from decrease to increase. However, from the time t3 to time t4, VBB>VTH still holds, and hence the lower side current IL continues to flow. As a result, the reference current IREF is still decreased corresponding to the lower side current IL.

When the power supply voltage VBB becomes lower than the threshold value voltage VTH at the time t4, the lower side current IL does not flow. Therefore, the reference current IREF is not decreased any more and returns to the same value as the upper side current IH.

After time t5, the power supply voltage VBB is maintained at the normal value Vnormal (<VTH) again. Therefore, the lower side current IL does not flow, and the reference current IREF is maintained at the upper side current IH.

As described above, in the overcurrent protection circuit 71, when an output short circuit of the load 3 is detected (SA=H), and when an abnormality of overcurrent of the output current Io is detected (SB=H), only in the case where the power supply voltage VBB is higher than the predetermined threshold value voltage VTH, the reference current IREF (therefore the overcurrent limit value Iocd of the output current Io) is linearly decreased according to a difference value between the power supply voltage VBB and the threshold value voltage VTH (i.e. VBB-VTH).

Figure 9:
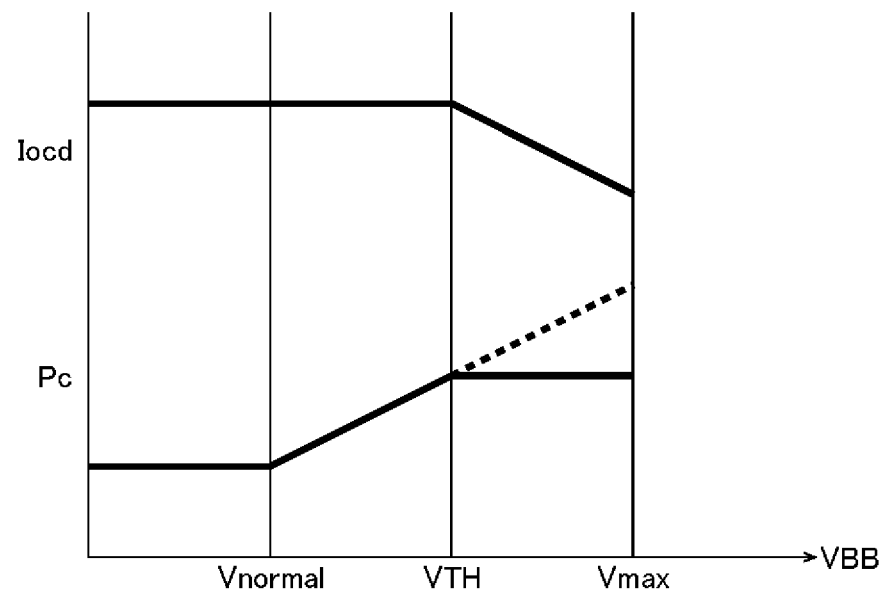
FIG. 9 is a correlation diagram between a power supply voltage VBB and an overcurrent limit value Iocd as well as a power consumption Pc.

FIG. 9 is a correlation diagram between the power supply voltage VBB and the overcurrent limit value Iocd as well as the power consumption Pc. As shown in this diagram, in the overcurrent protection circuit 71, it is preferred to decrease the overcurrent limit value Iocd of the output current Io, so that the power consumption Pc in the NMOSFET 10 becomes constant in a voltage range of the power supply voltage VB higher than the predetermined threshold value voltage VTH (Vnormal<VTH<VBB<Vmax).

As described above, in the overcurrent protection circuit 71 having the linear control function of the overcurrent limit value Iocd, when an output short circuit of the load 3 (and an overcurrent abnormality of the output current Io due to the same) is generated, even if an overvoltage abnormality of the power supply voltage VBB further occurs, the power consumption Pc of the NMOSFET 10 can be reduced or kept constant by appropriately decreasing the overcurrent limit value Iocd of the output current Io.

In a switch device like the semiconductor integrated circuit device 1 proposed above, in a low on-resistance range (e.g. a few mΩ to a few tens of mΩ) in which relatively large output current flows, or in a switch device for in-vehicle use that is not allowed to be destroyed in any case, it is very effective to have the linear control function of the overcurrent limit value Iocd described above as one measure against an output short circuit.

<Gate Control Unit (Second Structural Example)>

Figure 10:
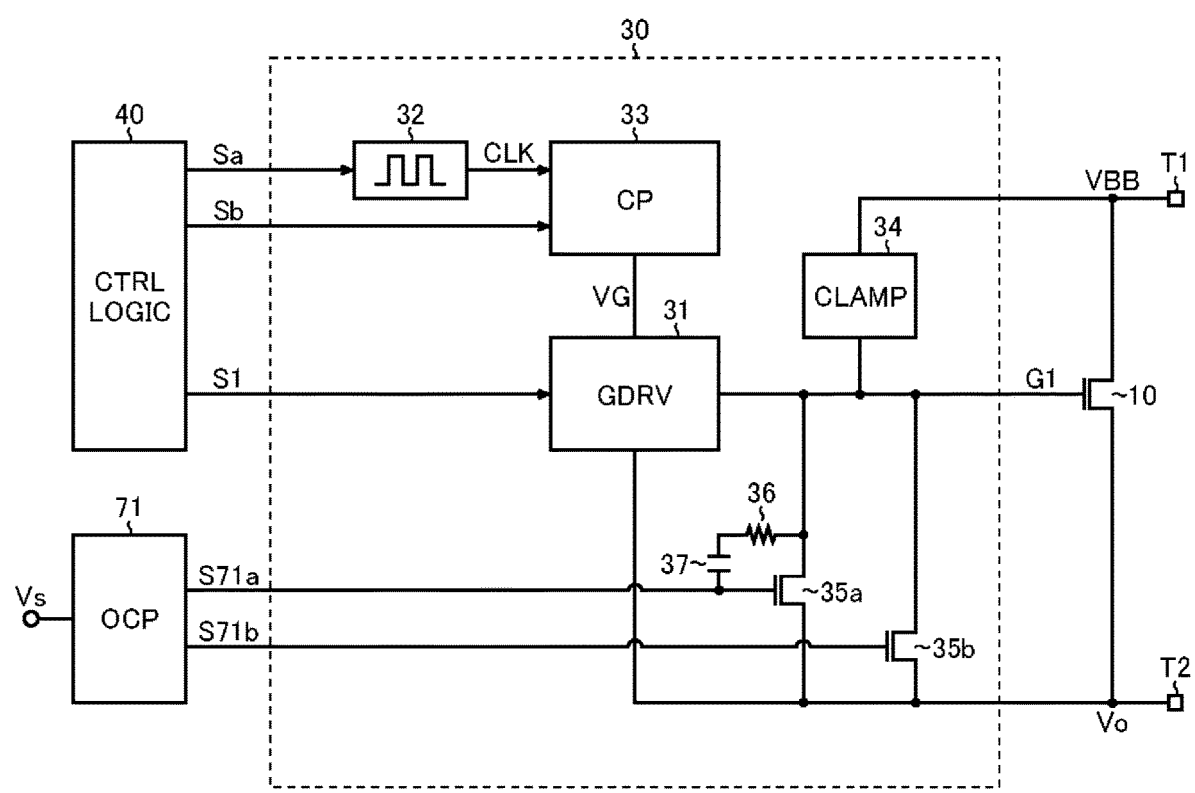
FIG. 10 is a block diagram illustrating a second structural example of the gate control unit.

FIG. 10 is a block diagram illustrating a second structural example of the gate control unit 30 and its periphery. The gate control unit 30 of this structural example includes the gate driver 31, the oscillator 32, the charge pump 33, the clamper 34, NMOSFETs 35a and 35b, the resistor 36 (having a resistance of R36), and the capacitor 37 (having a capacitance of C37).

The gate driver 31 is connected between an output terminal of the charge pump 33 (i.e. an application terminal of the stepped-up voltage VG) and the external terminal T2 (i.e. the application terminal of the output voltage Vo), so as to generate the gate drive signal G1 whose current capacity is increased from that of the gate control signal S1. Note that the gate drive signal G1 basically becomes high level (i.e. VG) when the gate control signal S1 is at high level, and becomes low level (i.e. Vo) when the gate control signal S1 is at low level.

The oscillator 32 generates the clock signal CLK having a predetermined frequency and outputs it to the charge pump 33. Note that the oscillator 32 is enabled or disabled according to the enable signal Sa from the control logic portion 40.

The charge pump 33 drives the flying capacitor (not shown) using the clock signal CLK so as to generate the stepped-up voltage VG higher than the power supply voltage VBB. Note that the charge pump 33 is enabled or disabled according to the enable signal Sb from the control logic portion 40.

The clamper 34 is connected between the external terminal T1 (i.e. the application terminal of the power supply voltage VBB) and the gate of the NMOSFET 10. In an application in which the inductive load 3 is connected to the external terminal T2, when the NMOSFET 10 is switched from on to off, a counter electromotive force of the load 3 makes the output voltage Vo become a negative voltage (<GND). For this reason, the clamper 34 (so-called active clamp circuit) is disposed for absorption of energy.

The drain of the NMOSFET 35a is connected to the gate of the NMOSFET 10. The source of the NMOSFET 35a is connected to the external terminal T2. Note that the gate of the NMOSFET 35a is applied with a first overcurrent protection signal S71a (corresponding to the overcurrent protection signal S71 described above) from the overcurrent protection circuit 71. In addition, the resistor 36 and the capacitor 37 are connected in series between the drain and gate of the NMOSFET 35a.

The drain of the NMOSFET 35b is connected to the gate of the NMOSFET 10. The source of the NMOSFET 35b is connected to the external terminal T2. The gate of the NMOSFET 35b is applied with a second overcurrent protection signal S71b from the overcurrent protection circuit 71. However, neither a resistor nor a capacitor is connected between the drain and gate of the NMOSFET 35b unlike the NMOSFET 35a.

In the gate control unit 30 of this structural example, the NMOSFET 35a is turned off when the first overcurrent protection signal S71a is at low level (i.e. a logic level when no abnormality is detected), and is turned on when the first overcurrent protection signal S71a is at high level (i.e. a logic level when an abnormality is detected). Therefore, when the first overcurrent protection signal S71a is raised to high level, the gate drive signal G1 is decreased from high level (i.e. VG) in the normal state with the predetermined time constant τ (=R36×C37). As a result, the conduction degree of the NMOSFET 10 is gradually decreased, so that the output current Io is limited. In contrast, when the first overcurrent protection signal S71a is decreased to low level, the gate drive signal G1 is increased with the predetermined time constant τ. As a result, the conduction degree of the NMOSFET 10 is gradually increased, and hence limitation of the output current Io is cancelled.

In addition, the NMOSFET 35b is turned off when the second overcurrent protection signal S71b is at low level (i.e. a logic level when the forced turn-off is cancelled), and is turned on when the second overcurrent protection signal S71b is at high level (i.e. a logic level in the forced turn-off). Therefore, when the second overcurrent protection signal S71b is raised to high level, the gate and source of the NMOSFET 10 are short-circuited, so that the NMOSFET 10 is forcibly turned off, and the output current Io is cut off without delay. In contrast, when the second overcurrent protection signal S71b is decreased to low level, the gate and source of the NMOSFET 10 are disconnected, and hence the forced turn-off of the NMOSFET 10 is cancelled.

<Current Protection Circuit (First Embodiment)>

Figure 11:
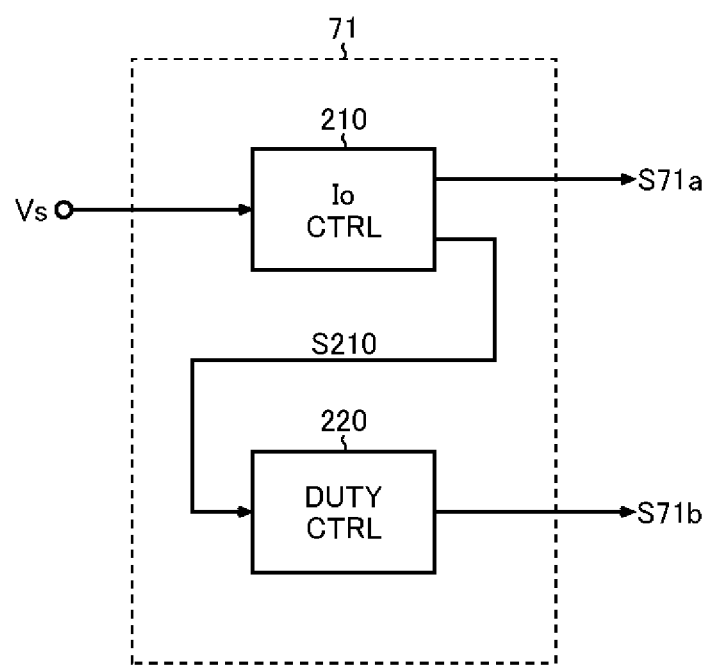
FIG. 11 is a block diagram illustrating a first embodiment of the overcurrent protection circuit.

FIG. 11 is a block diagram illustrating a first embodiment of the overcurrent protection circuit 71. The overcurrent protection circuit 71 of this embodiment includes a current control unit 210 and a duty control unit 220.

The current control unit 210 compares the sense voltage Vs (corresponding to the output current Io) with the predetermined threshold value voltage Vth (corresponding to the upper limit value Iocd of the output current Io, not shown in this diagram), so as to generate the first overcurrent protection signal S71a to control the conduction degree of the NMOSFET 10. In addition, the current control unit 210 also has a function of generating a status notification signal S210 for notifying the duty control unit 220 that the current control unit 210 limits the output current Io (S71a=H) based on a result of the comparison described above.

The duty control unit 220 is an example of an intermittent control unit that intermittently drives the NMOSFET 10 when an overcurrent is detected, and receives the status notification signal S210 so as to generate the second overcurrent protection signal S71b. More specifically, when the current limiting operation of the current control unit 210 (S71a=H) continues for a predetermined on period Ton, the duty control unit 220 generates the second overcurrent protection signal S71b so that the NMOSFET 10 is turned off for a predetermined off period Toff.

<Current Control Unit>

Figure 12:
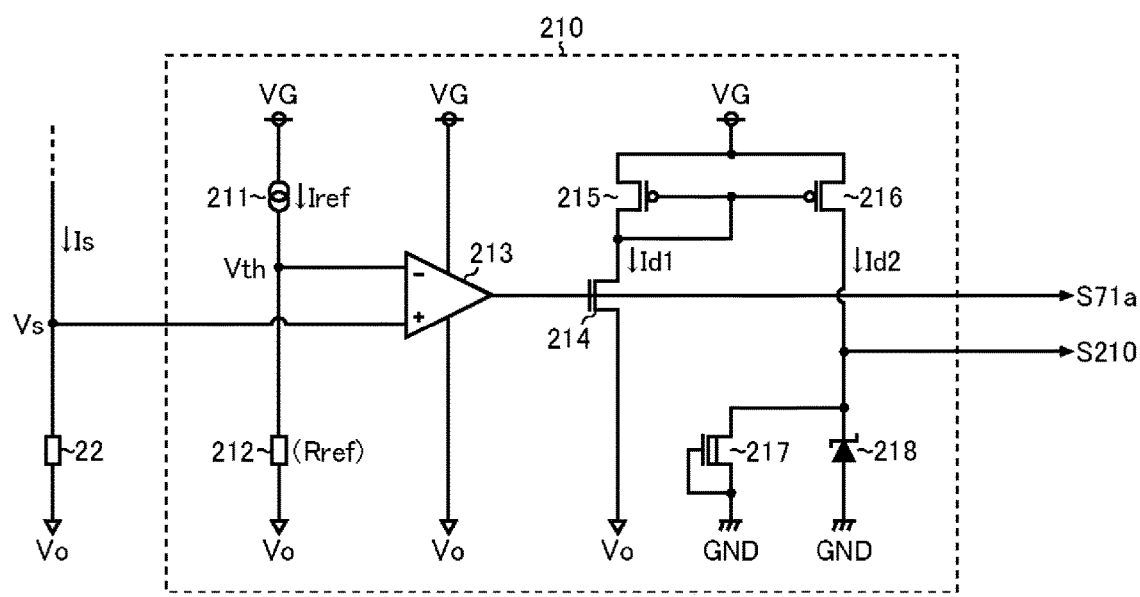
FIG. 12 is a circuit diagram illustrating a structural example of the current control unit.

FIG. 12 is a circuit diagram illustrating a structural example of the current control unit 210. The current control unit 210 of this structural example includes a current source 211, a resistor 212 (having a resistance of Rref), a comparator 213, an NMOSFET 214, PMOSFETs 215 and 216, a depletion type NMOSFET 217, and a zener diode 218.

A first terminal of the current source 211 and a power supply potential terminal of the comparator 213 are both connected to an application terminal of the stepped-up voltage VG. A second terminal of the current source 211 and a first terminal of the resistor 212 are both connected to an inverting input terminal (−) of the comparator 213. A non-inverting input terminal (+) of the comparator 213 is applied with the sense voltage Vs. A second terminal of the resistor 212 and a reference potential terminal of the comparator 213 are both connected to the application terminal of the output voltage Vo. An output terminal of the comparator 213 corresponds to an output terminal of the first overcurrent protection signal S71a.

The gate of the NMOSFET 214 is connected to an output terminal of the comparator 213. The source of the NMOSFET 214 is connected to the application terminal of the output voltage Vo. The drain of the NMOSFET 214 is connected to the drain of the PMOSFET 215. The sources of the PMOSFETs 215 and 216 are both connected to the application terminal of the stepped-up voltage VG. The gates of the PMOSFETs 215 and 216 are both connected to the drain of the PMOSFET 215. The drain of the PMOSFET 216 is connected to the drain of the NMOSFET 217 and the cathode of the zener diode 218. The gate and source of the NMOSFET 217 and the anode of the zener diode 218 are both connected to the ground terminal GND. Note that the drain of the PMOSFET 216 corresponds to an output terminal of the status notification signal S210.

The current source 211 generates a predetermined reference current Iref and supplies it to the resistor 212. Therefore, the inverting input terminal (−) of the comparator 213 is applied with the predetermined threshold value voltage Vth (=Iref×Rref). Note that a voltage value of the threshold value voltage Vth is set appropriately according to the upper limit value Iocd of the output current Io.

The comparator 213 compares the sense voltage Vs input to the non-inverting input terminal (+) with the threshold value voltage Vth input to the inverting input terminal (−), so as to generate the first overcurrent protection signal S71a. The first overcurrent protection signal S71a becomes low level (i.e. a logic level when no abnormality is detected) when the sense voltage Vs is lower than the threshold value voltage Vth, and becomes high level (i.e. a logic level when an abnormality is detected) when the sense voltage Vs is higher than the threshold value voltage Vth.

The NMOSFET 214 becomes turned off when the first overcurrent protection signal S71a is at low level, and becomes turned on when the first overcurrent protection signal S71a is at high level. The PMOSFETs 215 and 216 form a current mirror, which mirrors a drain current Id1 of the PMOSFET 215 so as to generate a drain current Id2 of the PMOSFET 216. The depletion type NMOSFET 217 functions as a constant current source because the gate and source thereof are connected to each other. The zener diode 218 functions as a clamp element that limits the upper limit value of the status notification signal S210.

In the current control unit 210 of this structural example, when the first overcurrent protection signal S71a is at low level, the NMOSFET 214 is turned off, and hence a current path from the drain of the PMOSFET 215 to the application terminal of the output voltage Vo is disconnected. Therefore, the drain currents Id1 and Id2 do not flow, and the status notification signal S210 becomes low level (i.e. a logic level when the limitation of the output current Io is cancelled).

On the contrary, when the first overcurrent protection signal S71a is at high level, the NMOSFET 214 is turned on, and hence the current path described above is connected. Therefore, the drain currents Id1 and Id2 flow, and the status notification signal S210 is at high level (i.e. a logic level when the output current Io is limited).

Figure 13:
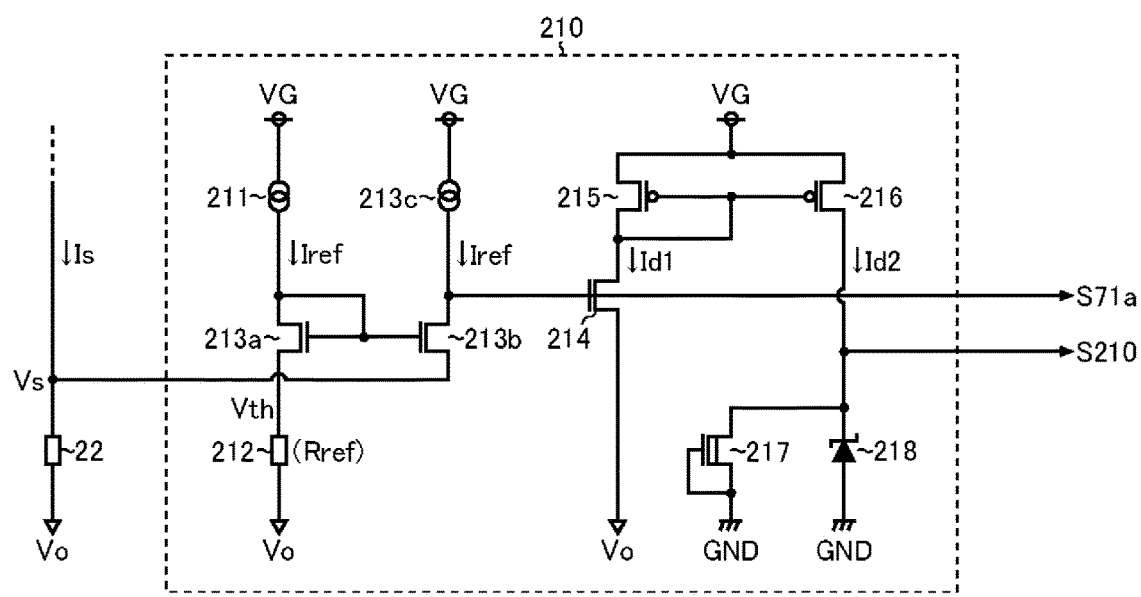
FIG. 13 is a circuit diagram illustrating a variation of the current control unit.

FIG. 13 is a circuit diagram illustrating a variation of the current control unit 210. The current control unit 210 of this variation is based on the circuit structure of FIG. 12 and includes NMOSFETs 213a and 213b and a current source 213c as circuit elements that substitute the comparator 213.

The first terminals of the current sources 211 and 213c are both connected to the application terminal of the stepped-up voltage VG. The second terminal of the current source 211 is connected to the drain of the NMOSFET 213a. A second terminal of the current source 213c is connected to the drain of the NMOSFET 213b. The source of the NMOSFET 213a is connected to the first terminal of the resistor 212. The second terminal of the resistor 212 is connected to the application terminal of the output voltage Vo. The gates of the NMOSFET 213a and the NMOSFET 213b are both connected to the drain of the NMOSFET 213a. The source of the NMOSFET 213b is applied with the sense voltage Vs. Note that the drain of the NMOSFET 213b corresponds to the output terminal of the first overcurrent protection signal S71a.

In this way, in the current control unit 210, it may be possible to adopt a comparison circuit using a current mirror as a circuit element that substitutes the comparator 213 in FIG. 12.

<Current Protection Operation>

Figure 14:
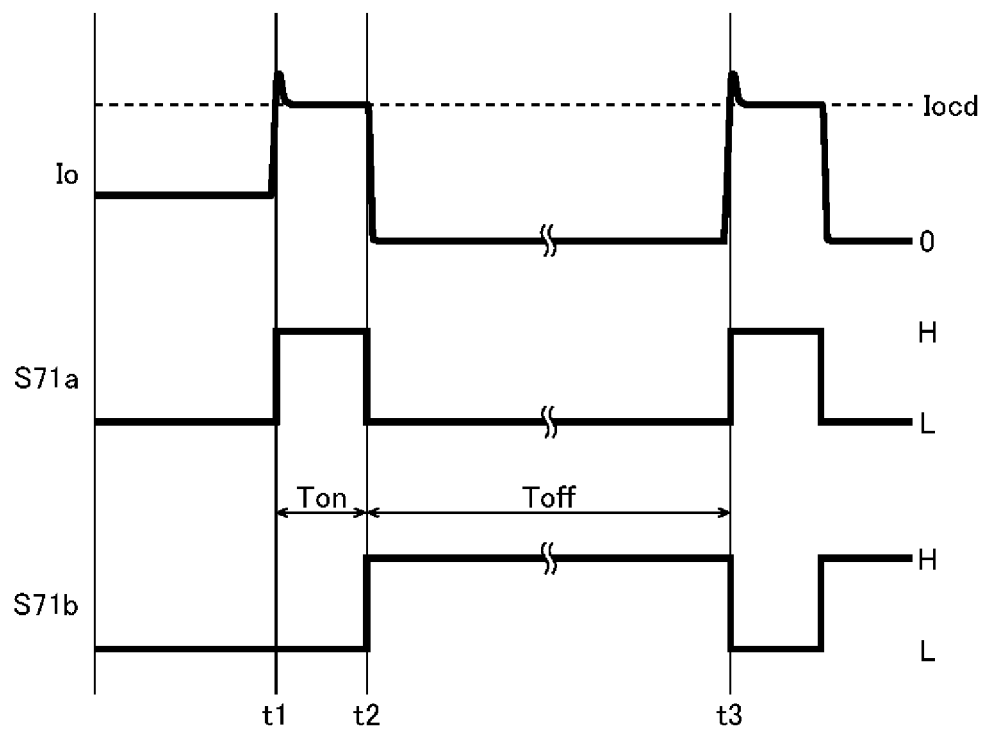
FIG. 14 is a timing chart illustrating an example of the overcurrent protection operation.

FIG. 14 is a timing chart showing an example of an overcurrent protection operation, in which the output current Io, the first overcurrent protection signal S71a, and the second overcurrent protection signal S71b are shown in order from top to bottom.

Before the time t1, the NMOSFET 10 is turned on so that the predetermined output current Io flows. In this case, if Io<Iocd holds, the first overcurrent protection signal S71a and the second overcurrent protection signal S71b are both at low level, and hence the overcurrent protection operation is not performed.

If an output short circuit of the load 3 (i.e. a short circuit to ground from the external terminal T2) or the like occurs at the time t1 so that the output current Io is increased to the upper limit value Iocd, the first overcurrent protection signal S71a is raised to high level. As a result, the output current Io is limited to the upper limit value Iocd or less. Further in this case, the duty control unit 220 starts to count the predetermined on period Ton (e.g. a few μsec to a few tens of μsec). Note that the second overcurrent protection signal S71b is maintained at low level until the count operation of the on period Ton is completed. Therefore, the NMOSFET 10 is not forcibly turned off.

When the count operation of the on period Ton is completed at the time t2 with the overcurrent limiting operation performed (S71a=H) by the current control unit 210, the second overcurrent protection signal S71b is raised to high level. As a result, the MOSFET 10 is forcibly turned off so that the output current Io does not flow, and hence the first overcurrent protection signal S71a is decreased to low level. Further in this case, the duty control unit 220 starts to count the predetermined off period Toff (e.g. a few hundreds of μsec). Note that the second overcurrent protection signal S71b is maintained at high level until the count operation of the off time Toff is completed.

When the count operation of the off time Toff is completed at the time t3, the second overcurrent protection signal S71b is decreased to low level. As a result, the forced turn-off of the MOSFET 10 is cancelled, and hence the output current Io starts to flow again. In this case, if the output short circuit of the semiconductor integrated circuit device 1 is not cancelled, the output current Io is raised again to the upper limit value Iocd. As a result, also after the time t3, the overcurrent protection operation similar to the above description is repeated.

In other words, after the time t1, the NMOSFET 10 alternately repeats the on period Ton and the off period Toff with a predetermined duty ratio Don (=Ton/T, where T=Ton+Toff).

Note that the duty ratio Don should be appropriately set so that junction temperature Tj of the semiconductor integrated circuit device 1 (particularly inside or in a vicinity of the NMOSFET 10) is securely decreased to a safe temperature range. For instance, the junction temperature Tj is not maintained in a high temperature range (150 to 175 degrees Celsius) after the time t1 if Don is set to approximately 4%, and it can be decreased to a sufficiently safe temperature range (approximately 70 to 80 degrees Celsius). Thus, safety of the semiconductor integrated circuit device 1 can be enhanced.

In this way, as an overcurrent protection method in the overcurrent protection circuit 71 of the first embodiment, a method of limiting the output current Io to the upper limit value Iocd or less without turning off the same (a so-called current limit method) and a method of intermittently turning on and off the output current Io with a predetermined duty ratio Don (a so-called duty control method) are combined.

In particular, the duty control method described above can be said to be a very effective control method to clear a reliability test unique to in-vehicle devices (e.g. a load short-circuit reliability test (such as automotive electronics council (AEC) Q100-012) to evaluate safety in a short circuit to power supply voltage or to ground from the output terminal).

However, the duty control method described above has bad compatibility with a capacitive load. This drawback is considered below.

<Start-Up Delay Occurrence>

Figure 15:
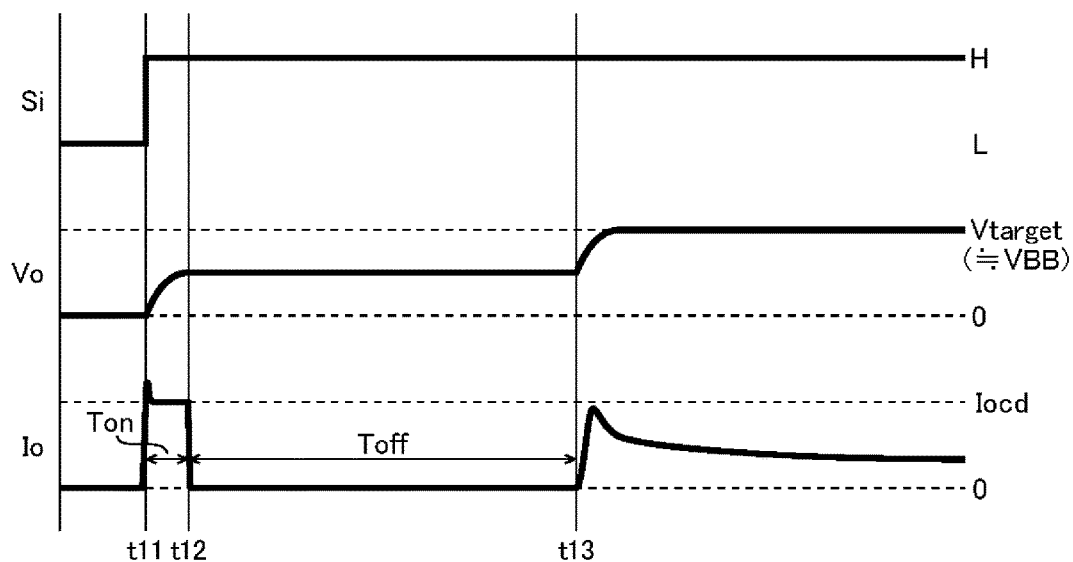
FIG. 15 is a timing chart illustrating a manner in which a startup delay occurs.

FIG. 15 is a timing chart showing a manner in which startup delay occurs due to the duty control, in which the external control signal Si, the output voltage Vo, and the output current Io are shown in order from top to bottom.

When the external control signal Si is raised to high level at time t11, the NMOSFET 10 is turned on so that the output current Io starts to flow. In this case, if a capacitive load such as a bulb lamp is connected as the load 3, or if an external capacitor is connected in parallel to the load 3, the output current Io larger than the upper limit value Iocd (i.e. inrush current) transiently flows until sufficient charge is stored in the capacitance. Therefore, the output current Io is limited to the predetermined upper limit value Iocd or less by the overcurrent protection operation of the current limit method.

In addition, when the on period Ton from the time t11 elapses at time t12, the NMOSFET 10 is forcibly turned off by the overcurrent protection operation of the duty control method. Therefore, the output current Io cannot flow into the capacitive load or the external capacitor connected to the external terminal T2, and hence the increase in the output voltage Vo (i.e. charging of the capacitance) is stopped.

Therefore, if the output voltage Vo does not reach a target value Vtarget (approximately VBB) before the overcurrent protection operation by the duty control method is performed, the output voltage Vo is raised step by step. As a result, startup time of the output voltage Vo is increased.

Note that in this chart, the NMOSFET 10 is turned on again at time t13, and consequently the output voltage Vo reaches the target value Vtarget (approximately VBB). In other words, the output voltage Vo is raised in two steps. However, the number of startup steps of the output voltage Vo may be further increased depending on a capacitance of the load 3 or a voltage value of the power supply voltage VBB, and a startup failure may occur depending on a set.

Further, if the duty control unit 220 is simply eliminated in order to cancel the startup delay or the startup failure described above, the forced turn-off control of the NMOSFET 10 is charged on the temperature protection circuit 73. As a result, when an output short circuit of the load 3 occurs, the NMOSFET 10 continues to turn on and off in the high temperature range (e.g. 150 to 175 degrees Celsius) in which detection and cancellation of the temperature abnormality due to the overcurrent are repeated, and hence safety of the semiconductor integrated circuit device 1 is sacrificed.

As means for achieving both stable startup and functional safety of the semiconductor integrated circuit device 1, a second embodiment of the overcurrent protection circuit 71 is proposed below.

<Current Protection Circuit (Second Embodiment)>

Figure 16:
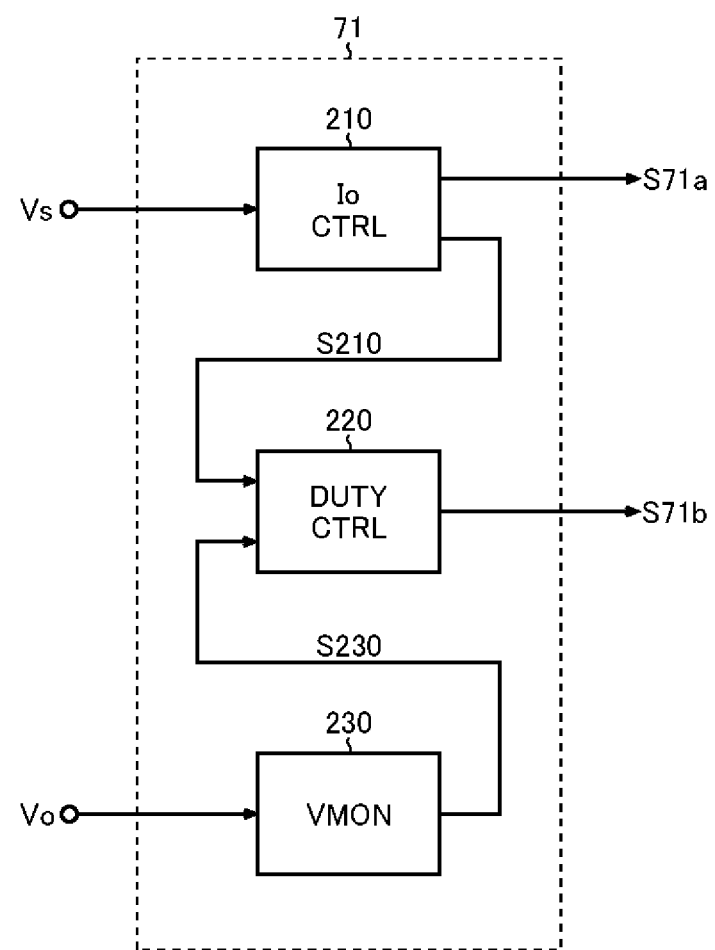
FIG. 16 is a block diagram illustrating a second embodiment of the overcurrent protection circuit.

FIG. 16 is a block diagram illustrating the second embodiment of the overcurrent protection circuit 71. The overcurrent protection circuit 71 of this embodiment is based on the first embodiment (FIG. 11) described above, and further includes an output voltage monitoring portion 230. Accordingly, the same structural element as the first embodiment is denoted by the same numeral or symbol as in FIG. 11 so that overlapping description is omitted, and characteristic parts of this embodiment are mainly described below.

The output voltage monitoring portion 230 generates an output voltage monitor signal S230 so that the duty control unit 220 is disabled until the output voltage Vo applied to the load 3 becomes its target value Vtarget (approximately VBB). The output voltage monitor signal S230 is at low level (i.e. a logic level when the duty control is disabled) when Vo<Vtarget (approximately VBB) holds, and is at high level (i.e. a logic level when the duty control is enabled) when Vo=Vtarget (approximately VBB) holds.

<Output Voltage Monitoring Portion>

Figure 17:
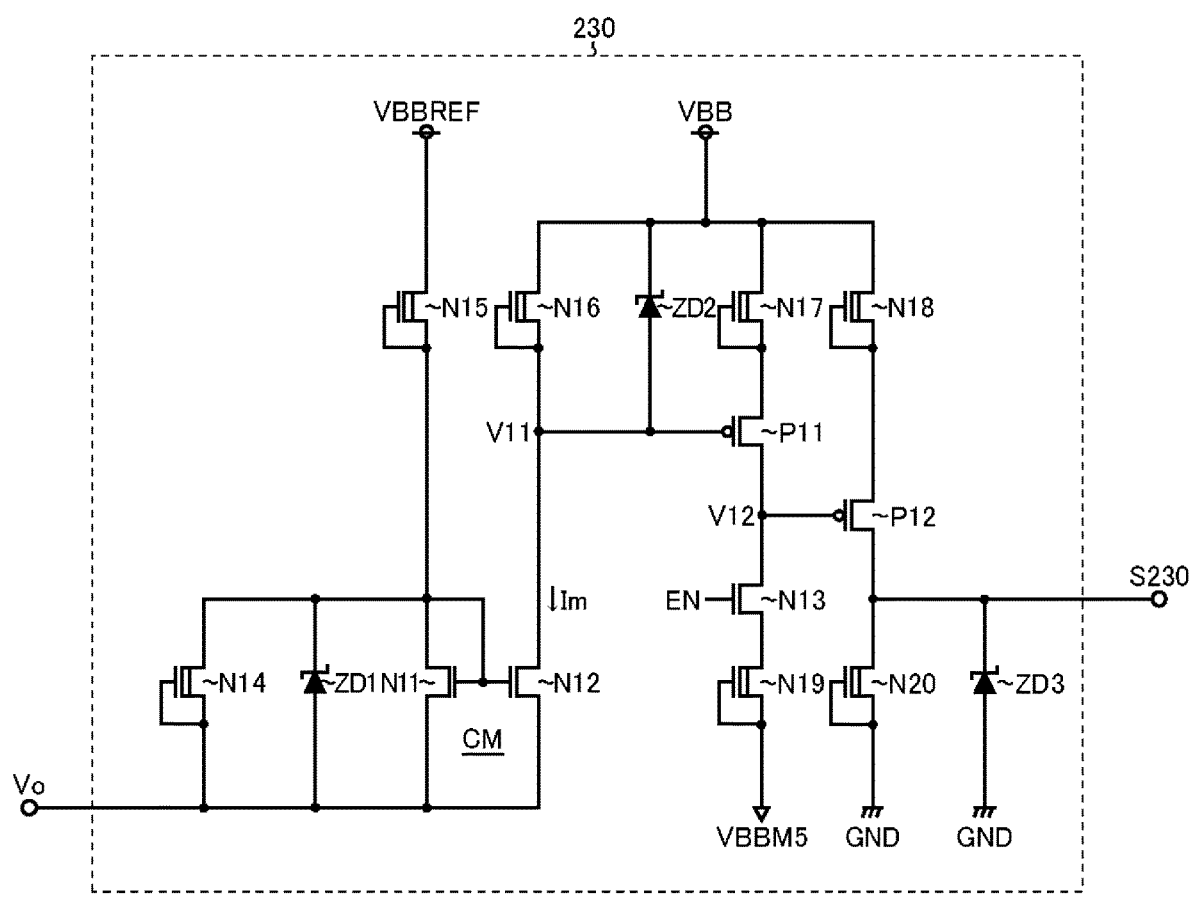
FIG. 17 is a circuit diagram illustrating a structural example of an output voltage monitoring portion.

FIG. 17 is a circuit diagram illustrating a structural example of the output voltage monitoring portion 230. The output voltage monitoring portion 230 of this structural example includes N-channel MOS field effect transistors N11 to N20, P-channel MOS field effect transistors P11 and P12, and zener diodes ZD1 to ZD3. Note that the transistors N11 to N13 are all enhancement types, and the transistors N14 to N20 are all depletion types.

The drain of the transistor N15 is connected to an application terminal of an internal voltage VBBREF (approximately VBB). The source and gate of the transistor N15 are connected to the drains of the transistors N11 and N14 and the cathode of the zener diode ZD1. The gates of the transistors N11 and N12 are both connected to the drain of the transistor N11. The sources of the transistors N11 and N12, the source and gate of the transistor N14, and the anode of the zener diode ZD1 are all connected to the application terminal of the output voltage Vo (i.e. the external terminal T2). Note that the transistors N11 and N12 connected in this way function as a current mirror CM.

The drains of the transistors N16 to N18 and the cathode of the zener diode ZD2 are all connected to the application terminal of the power supply voltage VBB (i.e. the external terminal T1). The source and gate of the transistor N16, the anode of a zener diode ZD2, and the gate of the transistor P11 are all connected to the drain of the transistor N12. The source and gate of the transistor N17 are connected to the source of the transistor P11. The source and gate of the transistor N18 are connected to the source of the transistor P12.

The drain of the transistor P11 is connected to the gate of the transistor P12 and the drain of the transistor N13. The source of the transistor N13 is connected to the drain of the transistor N19. The gate of the transistor N13 is connected to an input terminal of the enable signal EN. The source and gate of the transistor N19 are connected to an application terminal of the internal voltage VBBM5 (approximately VBB-5 V). As the transistor P11 that works between VBB and VBBM5, a low withstand voltage element (e.g. a withstand voltage of a few volts) can be used.

The drain of the transistor P12 is connected to the drain of the transistor N20, the cathode of the zener diode ZD3, and an output terminal of the output voltage monitor signal S230. The source and gate of the transistor N20 and the anode of the zener diode ZD3 are all connected to the ground terminal. As the transistor P12 that works between VBB and GND, it is necessary to use a high withstand voltage element (e.g. a withstand voltage of a few tens of volts).

Next, an operation of output voltage monitoring portion 230 is described. When the external control signal Si is raised to high level so that the NMOSFET 10 is turned on, the output voltage Vo starts to rise from 0 V at a predetermined slew rate. In this case, just after the NMOSFET 10 is turned on, a potential difference larger than an on threshold voltage of each of the transistors N11 and N12 is generated between VBBREF and Vo. Therefore, the current mirror CM is enabled so that a mirror current Im flows in the drain of the transistor N12. Consequently, a gate voltage V11 of the transistor P11 becomes low level (substantially the output voltage Vo). As a result, the transistor P11 is turned on, and a gate voltage V12 of the transistor P12 becomes high level (substantially the power supply voltage VBB), so that the transistor P12 is turned off, and the output voltage monitor signal S230 becomes low level (i.e. a logic level when the duty control is disabled).

After that, the potential difference between VBBREF and Vo is decreased along with an increase of the output voltage Vo. When the output voltage Vo reaches its target value Vtarget (approximately VBB), the potential difference between VBBREF and Vo becomes less than the on threshold voltages of the transistors N11 and N12. Therefore the current mirror CM is disabled so that the mirror current Im does not flow in the drain of the transistor N12, and hence the gate voltage V11 of the transistor P11 becomes high level (substantially the power supply voltage VBB). As a result, the transistor P11 is turned off, and the gate voltage V12 of the transistor P12 becomes low level (substantially the internal voltage VBBM5), so that the transistor P12 is turned off. Consequently, the output voltage monitor signal S230 becomes high level (i.e. a logic level when the duty control is enabled).

In this way, the output voltage monitoring portion 230 of this structural example can detect whether or not the output voltage Vo has reached the target value Vtarget (approximately VBB) with a very simple circuit structure.

Note that the transistor N13 is turned on when the enable signal EN is at high level and is turned off when the enable signal EN is at low level. Therefore, the output voltage monitoring portion 230 is enabled or disabled according to the enable signal EN. As the enable signal EN, it is possible to use the external control signal Si transmitted from the external terminal T3 via the signal input portion 50.

<Cancellation of Startup Delay>

Figure 18:
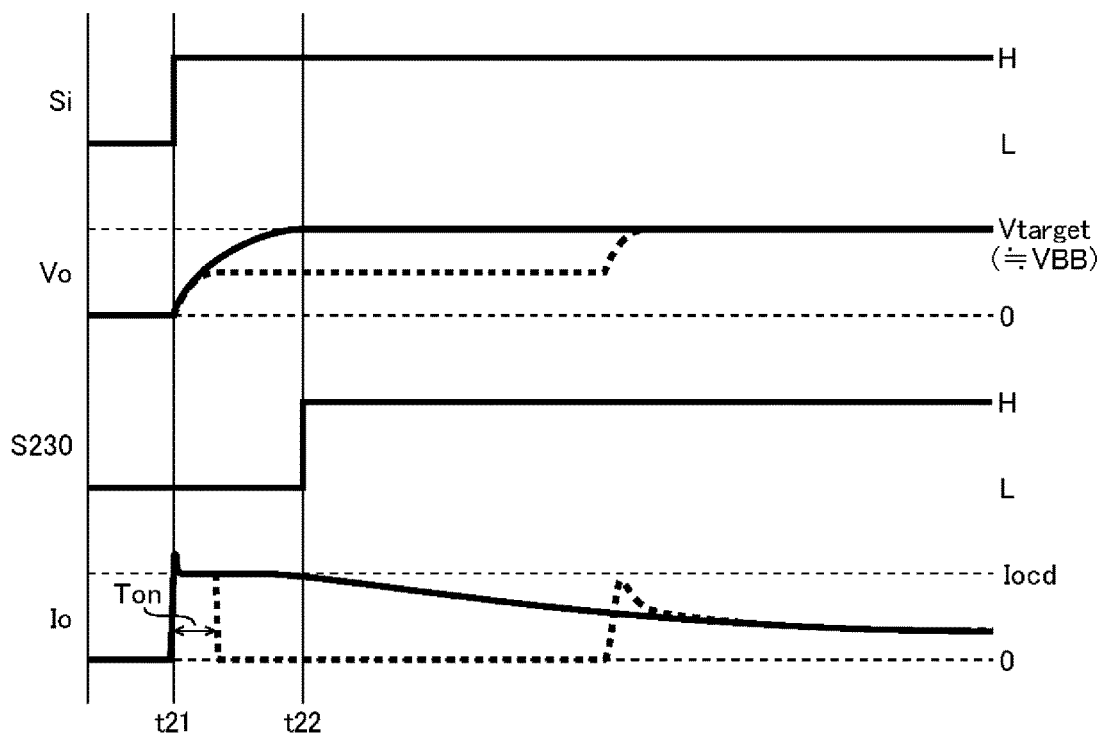
FIG. 18 is a timing chart illustrating a manner in which the startup delay is cancelled.

FIG. 18 is a timing chart showing a manner in which the startup delay is cancelled by introducing the output voltage monitoring portion 230, in which the external control signal Si, the output voltage Vo, the output voltage monitor signal S230, and the output current Io are shown in order from top to bottom. Note that solid lines in this chart indicate behaviors in the second embodiment (with the output voltage monitor), while broken lines in this chart indicate behaviors in the first embodiment (without the output voltage monitor).

When the external control signal Si is raised to high level at time t21, the NMOSFET 10 is turned on so that the output current Io starts to flow. In this case, if a capacitive load such as a bulb lamp is connected as the load 3, or if an external capacitor is connected in parallel to the load 3, the output current Io larger than the upper limit value Iocd (i.e. inrush current) transiently flows until sufficient charge is stored in the capacitance. Therefore, the output current Io is limited to the predetermined upper limit value Iocd or less by the overcurrent protection operation of the current limit method. This point is the same as already described above with reference to FIG. 15.

In contrast, the operation of the duty control unit 220 is disabled by the output voltage monitor signal S230 maintained at low level until the output voltage Vo reaches its target value Vtarget (approximately VBB). Therefore, when the on period Ton elapses from the time t21, the NMOSFET 10 is not forcibly turned off, and the overcurrent protection operation of the current limit method is continued. Therefore, the output current Io can continuously flow to the capacitive load or the external capacitor connected to the external terminal T2, so that the output voltage Vo can rise without delay, and hence the startup time of the output voltage Vo can be reduced.

After that, when the output voltage Vo reaches its target value Vtarget (approximately VBB) at time t22 so that the output voltage monitor signal S230 is raised to high level, the duty control unit 220 is enabled. As a result, after the time t22, if an overcurrent abnormality of the output current Io due to an output short circuit of the load 3 occurs, the overcurrent protection operation of the duty control method described above is enabled. Therefore, the junction temperature Tj of the semiconductor integrated circuit device 1 is not maintained in the high temperature range (150 to 175 degrees Celsius), and it can be decreased to the sufficiently safe temperature range (approximately 70 to 80 degrees Celsius) so that safety of the semiconductor integrated circuit device 1 can be enhanced.

As described above, in the overcurrent protection circuit 71 of the second embodiment, the duty control unit 220 is disabled so that the overcurrent protection operation of the current limit method is continued until the output voltage Vo is sufficiently raised after the NMOSFET 10 is turned on, and the duty control unit 220 is enabled after the output voltage Vo is sufficiently raised.

According to this overcurrent protection operation, compatibility between stable startup and functional safety of the semiconductor integrated circuit device 1 can be achieved, and hence various specifications of the load 3 can be flexibly supported, while functional safety required to the semiconductor integrated circuit device 1 can be cleared at high level.

In the above description, the output voltage monitor signal S230 is used as a the control signal for switching the duty control unit 220 between enabled and disabled in the overcurrent protection circuit 71. However, if there is any other abnormality protecting portion than the duty control unit 220 that can inhibit the output voltage Vo from rising, it is possible to use the output voltage monitor signal S230 as a control signal for switching the abnormality protecting portion between enabled and disabled. An application to the temperature protection circuit 73 is exemplified and described briefly below.

<Application to Temperature Protection Circuit>

Figure 19:
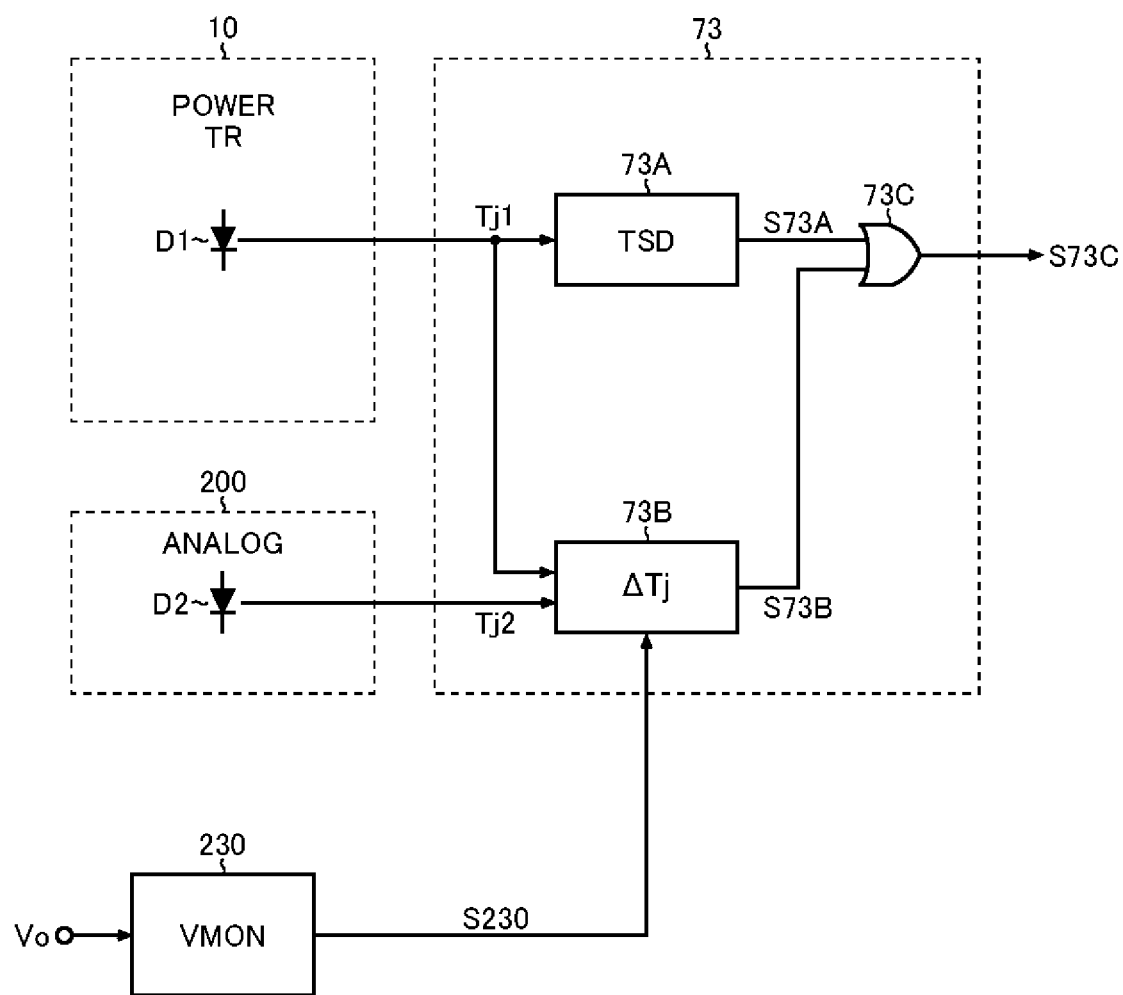
FIG. 19 is a block diagram illustrating a structural example of a temperature protection circuit.

FIG. 19 is a block diagram illustrating a structural example of the temperature protection circuit 73. The temperature protection circuit 73 of this structural example includes a first temperature detection portion 73A, a second temperature detection portion 73B, and a logical OR operator 73C.

The first temperature detection portion 73A (corresponding to the overheat protection portion) detects junction temperature Tj1 of the NMOSFET 10 using a temperature detection element D1 disposed inside or in a vicinity of the NMOSFET 10, and compares the detected value with a predetermined abnormality detection value (e.g. 175 degrees Celsius) as well as an abnormality cancellation value (e.g. 150 degrees Celsius), so as to generate a first temperature protection signal S73A. The first temperature protection signal S73A becomes high level (i.e. a logic level when an abnormality is detected) when the junction temperature Tj1 becomes higher than the abnormality detection value, and becomes low level (i.e. a logic level when no abnormality is detected) when the junction temperature Tj1 becomes lower than the abnormality cancellation value.

The second temperature detection portion 73B (corresponding to the temperature difference protection portion) detects junction temperature Tj2 of an integrated circuit 200 (such as the control logic portion 40) except the NMOSFET 10 using a temperature detection element D2 disposed inside or in a vicinity of the integrated circuit 200. The second temperature detection portion 73B compares a temperature difference $\Delta Tj$ ($=Tj1-Tj2$) between the junction temperature Tj1 and the junction temperature Tj2 with a predetermined abnormality detection value (e.g. 60 degrees Celsius) as well as an abnormality cancellation value (e.g. 45 degrees Celsius), so as to generate a second temperature protection signal S73B. The second temperature protection signal S73B becomes high level (i.e. a logic level when an abnormality is detected) when the temperature difference $\Delta Tj$ becomes more than the abnormality detection value and becomes low level (i.e. a logic level when no abnormality is detected) when the temperature difference $\Delta Tj$ becomes less than the abnormality cancellation value.

The logical OR operator 73C performs a logical OR operation between the first temperature protection signal S73A and the second temperature protection signal S73B so as to generate a third temperature protection signal S73C. The third temperature protection signal S73C becomes low level when the first temperature protection signal S73A and the second temperature protection signal S73B are both at low level, and becomes high level when at least one of the first temperature protection signal S73A and the second temperature protection signal S73B is at high level. The third temperature protection signal S73C is output to the control logic portion 40 (or the gate control unit 30) instead of the temperature protection signal S73 (see FIG. 1) described above.

The temperature protection circuit 73 having the structure described above performs self-reset type temperature protection operation, in which the NMOSFET 10 is forcibly turned off when the junction temperature Tj1 or the temperature difference $\Delta Tj$ becomes higher than the corresponding abnormality detection value, and the forced turn-off of the NMOSFET 10 is cancelled when the junction temperature Tj1 or the temperature difference $\Delta Tj$ becomes lower than the corresponding abnormality cancellation value.

Similarly to the duty control unit 220 described above, the second temperature detection portion 73B corresponds to the intermittent control unit that intermittently drives the NMOSFET 10 when an abnormality is detected, and it is switched between enabled and disabled according to the output voltage monitor signal S230. More specifically, the second temperature detection portion 73B is disabled when S230 is at low level (i.e. when Vo<Vtarget (approximately VBB) holds), and is enabled when S230 is at high level (i.e. when Vo=Vtarget (approximately VBB) holds).

Therefore, after the NMOSFET 10 is turned on, even if the temperature difference $\Delta Tj$ becomes more than the abnormality detection value when the output voltage Vo has not reached the target value Vtarget (approximately VBB), the second temperature protection signal S73B is not raised to high level, and the NMOSFET 10 is not forcibly turned off. Therefore, the output voltage Vo can be raised without delay, and therefore the startup time of the output voltage Vo can be reduced.

As described above, the output voltage monitor signal S230 can be used also as the control signal for enabling or disabling the second temperature detection portion 73B of the temperature protection circuit 73.

In contrast, the first temperature detection portion 73A is the same as the second temperature detection portion 73B in that it intermittently drives the NMOSFET 10 when an abnormality is detected. However, the first temperature detection portion 73A does not receive an input of the output voltage monitor signal S230, and the operation thereof is always enabled.

Therefore, when the junction temperature Tj1 of the NMOSFET 10 becomes higher than the abnormality detection value, even if the output voltage Vo has not reached its target value Vtarget (approximately VBB), the NMOSFET 10 is forcibly turned off. This temperature protection operation can protect the NMOSFET 10 from thermal breakdown, and hence safety of the semiconductor integrated circuit device 1 can be enhanced.

<Application to Vehicle>

Figure 20:
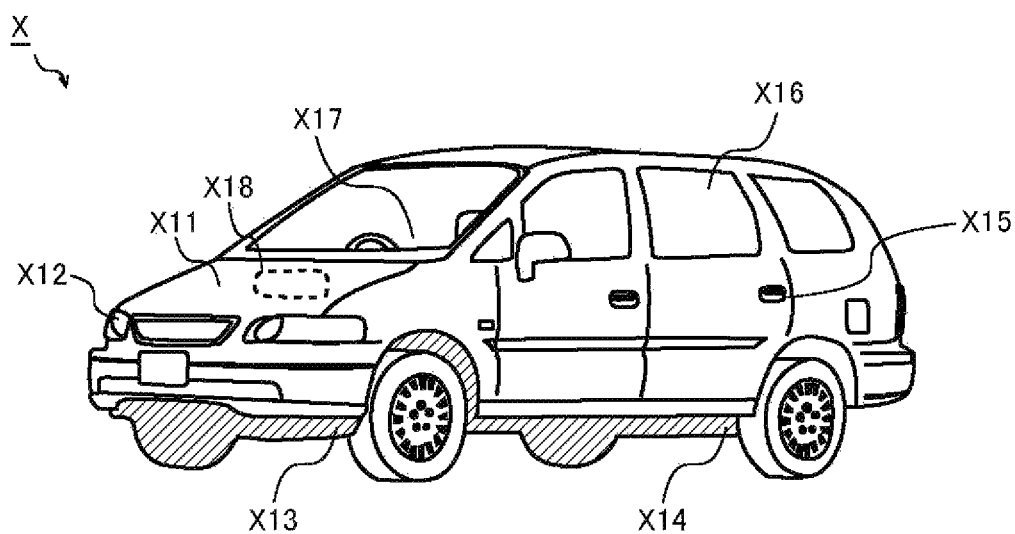
FIG. 20 is an external view illustrating a structural example of a vehicle.

FIG. 20 is an external view illustrating a structural example of a vehicle. A vehicle X of this structural example is equipped with a battery (not shown in this view), and various electronic apparatuses X11 to X18 that operate with power supply from the battery. Positions of the electronic apparatus X11 to X18 in this view may be different from actual positions for convenience sake of illustration.

The electronic apparatus X11 is an engine control unit that performs control of an engine (such as injection control, electronic throttle control, idling control, oxygen sensor heater control, and automatic cruise control).

The electronic apparatus X12 is a lamp control unit that performs on/off control of a high intensity discharged lamp (HID), a daytime running lamp (DRL), and the like.

The electronic apparatus X13 is a transmission control unit that performs control of a transmission.

The electronic apparatus X14 is a body control unit that performs control of movement of the vehicle X (such as anti-lock brake system (ABS) control, electric power steering (EPS) control, and electronic suspension control).

The electronic apparatus X15 is a security control unit that performs drive control of door lock, anti-theft alarm, and the like.

The electronic apparatus X16 is an electronic apparatus such as a wiper, electric door mirrors, a power window, a clamper (shock absorber), an electric sunroof, or an electric sheet, which is mounted in the vehicle X as standard equipment or a manufacturer option when shipped from a factory.

The electronic apparatus X17 is an electronic apparatus such as in-vehicle audio/visual (A/V) equipment, a navigation system, or an electronic toll collection system (ETC), which is mounted in the vehicle X as a user option.

The electronic apparatus X18 is an electronic apparatus such as an in-vehicle blower, an oil pump, a water pump, or a battery cooling fan, which includes a high withstand voltage motor.

The semiconductor integrated circuit device 1, the ECU 2, and the load 3 described above can be incorporated in any of the electronic apparatuses X11 to X18.

<Other Variations>

In addition, in the embodiments described above, an in-vehicle high side switch IC connected between the power supply terminal and the load is exemplified and described, but the application target of the invention disclosed in this specification is not limited to this. For instance, the invention can be widely applied to semiconductor integrated circuit devices other than the in-vehicle use, in addition to other in-vehicle IPD (an in-vehicle low side switch IC connected between the load and the ground terminal, or an in-vehicle power supply IC).

In addition, various technical features disclosed in this specification can be variously modified within the spirit of the technical creation, other than the embodiments described above. In other words, the embodiments described above are merely examples in every aspect and should not be interpreted as limitations. The technical scope of the present invention is defined not by the above description of the embodiments but by the claims, and should be understood to include all modifications within the meanings and scope equivalent to the claims.

<Summary>

Various embodiments disclosed in this specification are summarized below.

The switch device disclosed in this specification has a structure including a switching element arranged to connect/disconnect a current path from a power supply terminal to a ground terminal via a load, and an overcurrent protection circuit arranged to limit output current flowing in the switching element to be an overcurrent limit value or less, in which when an output short circuit of the load is detected, the overcurrent protection circuit decreases the overcurrent limit value to be smaller as a power supply voltage is higher (first structure).

Further, the switch device according to the first structure preferably has a structure in which the overcurrent protection circuit decreases the overcurrent limit value only when the power supply voltage is higher than a predetermined threshold value voltage (second structure).

In addition, the switch device according to the first or second structure preferably has a structure in which the overcurrent protection circuit includes a reference current generation portion arranged to generate a reference current, and a comparison portion arranged to compare a threshold value voltage corresponding to the reference current with a sense voltage corresponding to the output current so as to generate an overcurrent protection signal, and when an output short circuit of the load is detected, the reference current generation portion decreases the reference current to be smaller as the power supply voltage is higher (third structure).

In addition, the switch device according to the third structure preferably has a structure in which the reference current generation portion includes a differential amplifier portion arranged to amplify a difference value between the power supply voltage or its divided voltage and a predetermined reference voltage so as to generate a differential amplified voltage, an upper side current generation portion arranged to generate a predetermined upper side current, a lower side current generation portion arranged to generate a lower side current corresponding to the differential amplified voltage, and a difference current generation portion arranged to output a difference current obtained by subtracting the lower side current from the upper side current, as the reference current (fourth structure).

In addition, the switch device according to the fourth structure preferably has a structure in which the reference current generation portion further includes a lower side current control unit arranged to stop output of the lower side current when at least one of an output short circuit of the load and an overcurrent abnormality of the output current is not detected (fifth structure).

In addition, the switch device according to the fifth structure preferably has a structure in which the lower side current control unit stops output of the lower side current also when an overvoltage abnormality of the power supply voltage is not detected (sixth structure).

In addition, an electronic apparatus disclosed in this specification has a structure including the switch device according to one of the first to sixth structures, and a load connected to the switch device (seventh structure).

The electronic apparatus according to the seventh structure preferably has a structure in which the switch device is a high side switch connected between the power supply terminal and the load, or a low side switch connected between the load and the ground terminal (eighth structure).

In addition, the electronic apparatus according to the seventh or eighth structure preferably has a structure in which the load is one of a bulb lamp, a relay coil, a solenoid, a light emitting diode, and a motor (ninth structure).

In addition, a vehicle disclosed in this specification has a structure including the electronic apparatus according to one of the seventh to ninth structures (tenth structure).

In addition, a switch device disclosed in this specification has a structure including a switching element arranged to connect/disconnect a current path from a power supply terminal to a ground terminal via a load, an intermittent control unit arranged to intermittently drive the switching element when an abnormality is detected, and an output voltage monitoring portion arranged to disable the intermittent control unit until an output voltage applied to the load reaches its target value (eleventh structure).

Further, the switch device according to the eleventh structure preferably has a structure further including a current control unit arranged to limit output current flowing in the switching element to be a predetermined upper limit value or less (twelfth structure).

In addition, the switch device according to the twelfth structure preferably has a structure in which the intermittent control unit includes a duty control unit arranged to turn off the switching element for a predetermined off period when the current limiting operation by the current control unit continues for a predetermined on period (thirteenth structure).

In addition, the switch device according to the thirteenth structure preferably has a structure in which the current control unit compares a sense voltage corresponding to the output current with a threshold value voltage corresponding to the upper limit value, so as to generate a first overcurrent protection signal for controlling a conduction degree of the switching element and a status notification signal for notifying the duty control unit that the current control unit currently limits the output current (fourteenth structure).

In addition, the switch device according to one of the eleventh to fourteenth structures preferably has a structure in which the intermittent control unit includes a temperature difference protection portion arranged to turn off the switching element when a temperature difference between the switching element and other integrated circuits is abnormal (fifteenth structure).

In addition, the switch device according to one of the eleventh to fifteenth structures preferably has a structure further including an overheat protection portion arranged to turn off the switching element when a temperature of the switching element is abnormal even if the output voltage has not reached its target value (sixteenth structure).

In addition, an electronic apparatus disclosed in this specification has a structure including the switch device according to one of the eleventh to sixteenth structures, and a load connected to the switch device (seventeenth structure).

Further, the electronic apparatus according to the seventeenth structure preferably has a structure in which the switch device is a high side switch connected between the power supply terminal and the load, or a low side switch connected between the load and the ground terminal (eighteenth structure).

In addition, the electronic apparatus according to the seventeenth or eighteenth structure preferably has a structure in which the load is one of a bulb lamp, a relay coil, a solenoid, a light emitting diode, and a motor (nineteenth structure).

In addition, a vehicle disclosed in this specification has a structure including the electronic apparatus according to one of the seventeenth to nineteenth structures (twentieth structure).

INDUSTRIAL APPLICABILITY

The invention disclosed in this specification can be used for an in-vehicle IPD (such as an in-vehicle switch having high versatility), for example.

What is claimed is:
1. A switch device comprising:
a switching element arranged to connect/disconnect a current path from a power supply terminal to a ground terminal via a load; and
an overcurrent protection circuit arranged to limit output current flowing in the switching element to be an overcurrent limit value or less, wherein
when an output short circuit of the load is detected, the overcurrent protection circuit decreases the overcurrent limit value to be smaller as a power supply voltage is higher,
wherein the overcurrent protection circuit includes:
a reference current generation portion arranged to generate a reference current, and
a comparison portion arranged to compare a threshold value voltage corresponding to the reference current with a sense voltage corresponding to the output current so as to generate an overcurrent protection signal, and
when an output short circuit of the load is detected, the reference current generation portion decreases the reference current to be smaller as the power supply voltage is higher, and
wherein the reference current generation portion includes:
a differential amplifier portion arranged to amplify a difference value between the power supply voltage or its divided voltage and a predetermined reference voltage so as to generate a differential amplified voltage,
an upper side current generation portion arranged to generate a predetermined upper side current,
a lower side current generation portion arranged to generate a lower side current corresponding to the differential amplified voltage, and
a difference current generation portion arranged to output a difference current obtained by subtracting the lower side current from the upper side current, as the reference current.

2. The switch device according to claim 1, wherein the overcurrent protection circuit decreases the overcurrent limit value only when the power supply voltage is higher than a predetermined threshold value voltage.

3. The switch device according to claim 1, wherein the reference current generation portion further includes a lower side current control unit arranged to stop output of the lower side current when at least one of an output short circuit of the load and an overcurrent abnormality of the output current is not detected.

4. The switch device according to claim 3, wherein the lower side current control unit stops output of the lower side current also when an overvoltage abnormality of the power supply voltage is not detected.

5. An electronic apparatus comprising:
the switch device arranged to claim 1, and
a load connected to the switch device.

6. The electronic apparatus according to claim 5, wherein the switch device is a high side switch connected between the power supply terminal and the load, or a low side switch connected between the load and the ground terminal.

7. The electronic apparatus according to claim 5, wherein the load is one of a bulb lamp, a relay coil, a solenoid, a light emitting diode, and a motor.

8. A vehicle comprising the electronic apparatus according to claim 5.

* * * * *